(12) United States Patent
Arbell et al.

(10) Patent No.: US 9,109,163 B2
(45) Date of Patent: Aug. 18, 2015

(54) LIGHTING DEVICES WITH PRESCRIBED COLOUR EMISSION

(75) Inventors: Hagai Arbell, Jerusalem (IL); Uri Banin, Mevasseret Zion (IL)

(73) Assignee: YISSUM RESEARCH DEVELOPMENT COMPANY OF THE HEBREW UNIVERSITY OF JERUSALEM LTD., Jerusalem (IL)

( * ) Notice: Subject to any disclaimer, the term of this patent is extended or adjusted under 35 U.S.C. 154(b) by 336 days.

(21) Appl. No.: 13/575,845

(22) PCT Filed: Jan. 27, 2011

(86) PCT No.: PCT/IB2011/050366
§ 371 (c)(1),
(2), (4) Date: Oct. 16, 2012

(87) PCT Pub. No.: WO2011/092646
PCT Pub. Date: Aug. 4, 2011

(65) Prior Publication Data
US 2013/0026506 A1 Jan. 31, 2013
US 2013/0181234 A2 Jul. 18, 2013

Related U.S. Application Data

(60) Provisional application No. 61/299,018, filed on Jan. 28, 2010, provisional application No. 61/299,012, filed on Jan. 28, 2010.

(51) Int. Cl.
*H01B 1/06* (2006.01)
*H01B 1/10* (2006.01)
(Continued)

(52) U.S. Cl.
CPC ............... *C09K 11/883* (2013.01); *C09K 11/02* (2013.01); *C09K 11/565* (2013.01); *H01L 33/502* (2013.01); *H01L 33/505* (2013.01)

(58) Field of Classification Search
CPC .............................. H01L 33/502; C09K 11/02
See application file for complete search history.

(56) References Cited

U.S. PATENT DOCUMENTS 7,102,152 B2   9/2006 Chua et al.
7,264,527 B2   9/2007 Bawendi et al.
(Continued)

FOREIGN PATENT DOCUMENTS

| CN | 101517035 A | 8/2009 |
| CN | 101536604 A | 9/2009 |
| KR | 2009093202 A | 9/2009 |
| WO | 2008134056 A1 | 11/2008 |
| WO | WO2011092647 A2 | 8/2011 |

OTHER PUBLICATIONS

Z. Liu et al., Status and prospects for phosphor-based white LED Packaging, Front. Optoelectron, 2009, 119-140, 2(2): 119-140, China.
(Continued)

*Primary Examiner* — Caleb Henry
*Assistant Examiner* — Mounir Amer
(74) *Attorney, Agent, or Firm* — Browdy and Neimark, PLLC

(57) ABSTRACT

Optical conversion layers based on semiconductor nanoparticles for use in lighting devices, and lighting devices including same. In various embodiments, spherical core/shell seeded nanoparticles (SNPs) or nanorod seeded nanoparticles (RSNPs) are used to form conversion layers with superior combinations of high optical density (OD), low re-absorbance and small FRET. In some embodiments, the SNPs or RSNPs form conversion layers without a host matrix. In some embodiments, the SNPs or RSNPs are embedded in a host matrix such as polymers or silicone. The conversion layers can be made extremely thin, while exhibiting the superior combinations of optical properties. Lighting devices including SNP or RSNP-based conversion layers exhibit energetically efficient superior prescribed color emission.

36 Claims, 16 Drawing Sheets

(51) Int. Cl.
*H01L 33/50* (2010.01)
*H01B 1/00* (2006.01)
*B82Y 30/00* (2011.01)
*B82Y 20/00* (2011.01)
*C09K 11/88* (2006.01)
*C09K 11/02* (2006.01)
*C09K 11/56* (2006.01)

(56) References Cited

U.S. PATENT DOCUMENTS

| | | |
|---|---|---|
| 7,318,651 B2 | 1/2008 | Chua et al. |
| 7,495,383 B2 | 2/2009 | Chua et al. |
| 7,645,397 B2 | 1/2010 | Parce et al. |
| 2005/0167684 A1 | 8/2005 | Chua et al. |
| 2008/0173886 A1 | 7/2008 | Cheon et al. |
| 2009/0121190 A1* | 5/2009 | Parce et al. ............. 252/301.6 S |
| 2009/0162011 A1 | 6/2009 | Coe-Sullivan et al. |

OTHER PUBLICATIONS

Joseph R. Lakowicz, Principles of Fluorescence Spectroscopy, Kluwer Academic, 1999, pp. 367-443, 2nd edition, Plenum Publishers, New York, United States.

L. Carbone et al., Synthesis and Micrometer-Scale Assembly of Colloidal CdSe/CdS Nanorods Prepared by a Seeded Growth Approach, Nano Letters, 2007, pp. 2942-2950, vol. 7 No. 10, Washington D.C., United States.

Liang Li and Peter Reiss, One-pot Synthesis of Highly Luminescent InP/ZnS Nanocrystals without Precursor Injection, Journal of the American Chemical Society, Aug. 8, 2008, pp. 11588-11589, vol. 130, No. 35, Washington D.C., United States.

Young-Wook Jun et al., Shape Control of Semiconductor and Metal Oxide Nanocrystals through Nonhydrolytic Colloidal Routes, Angewndte Chemie International Edition, May 19, 2006, pp. 3414-3439, vol. 45, No. 21, Weinheim, Germany.

Dirk D et al., ZnSe Quantum Dots Within CdS Nonorods: A Seeded-Growth Type-II System, Small, Aug. 4, 2008, pp. 1319-1323, vol. 4, No. 9, Weinheim, Germany.

Jan Ziegler, Silica-Coated InP/ZnS Nanocrystals as Converter Material in White LEDs, Advanced Materials, Oct. 13, 2008, pp. 4068-4073, vol. 20, No. 21, Weinheim, Germany.

S.P. Ahrenkiel et al "Synthesis and Characterization of Colloidal InP Quantum Rods", Nono Letters, 3:6:833-83 (2003).

Deka S et al: "CdSe/CdS/ZnS Double Shell Nonorods with High Photoluminescence Efficiency and Their Exploitation as Biolabeling Probes", Journal of the American Chemical Society, ACS Publications, US, 131:8:2948-2958 (2009).

Search Report of Chinese Patent Application No. 201180007252.1, dated Dec. 6, 2013.

* cited by examiner (A)

(B)

(C)

Known Art (A)

(B)

(A)

(B)

(A)

(B)

LIGHTING DEVICES WITH PRESCRIBED COLOUR EMISSION

CROSS REFERENCE TO RELATED APPLICATIONS

This application claims priority from U.S. Provisional Patent Applications No. 61/299,012 filed Jan. 28, 2010 and titled "Light source with prescribed colour emission" and 61/299,018 filed Jan. 28, 2010 and titled "Phosphor-nanoparticle combination", both of which are incorporated herein by reference in its entirety.

FIELD AND BACKGROUND

Embodiments of the invention relate in general to optical devices which comprise semiconductor nanoparticles and in particular to lighting devices which include conversion layers having semiconductor quantum confined nanoparticles.

Light emitting diodes (LED) offer significant advantages over incandescent and fluorescent lamps with respect to their high energy efficiency and long lifetimes. LEDs are applicable in diverse applications including displays, automobile and signage lighting and domestic and street lighting.

A LED can emit monochromatic light in different regions of the spectrum, depending on the inorganic semiconductor compound used to fabricate it. However, "white" light, which is required for a very large portion of the lighting industry, cannot be generated using a conventional LED. Current solutions of producing white light include the use of three or more LEDs with various colours (e.g. Red, Green and Blue or "RGB"), or the use of a colour conversion layer of phosphor material (e.g. Cerium:YAG) to generate a broad white spectral emission from the ultraviolet (UV) or blue emission of a LED. However, such white light is almost always non-ideal and has in many cases undesired or unpleasant characteristics which may require improvement or correction.

Colloidal based semiconductor quantum dots (QD) offer the possibility of obtaining a colour gamut similar to and even better than the one obtained with the multi-LED solution, using the narrow-band emission of a QD tunable by size. Conversion layers incorporating ODs are known, see e.g. U.S. Pat. Nos. 7,264,527 and 7,645,397 and US patent applications 2008/0173886 and 2009/0162011. However, conversion layers based on QDs have challenges. These include for example losses due to re-absorption effects, whereby the QD emission is reabsorbed by other QDs in the layer. Generally this will occur for a red QD absorbing the emission emanating from QDs which emit more to the blue. This undesired process leads to reduced energy efficiency of a regular QD conversion layer and also to changes in the colour composition. The inherent size distribution of QD samples already provides different colours around a central colour. Therefore, re-absorption will take place inherently within such a layer. In devices where phosphor is used as part of a light conversion scheme to produce green light, the QD layers will absorb partially the light from the phosphor as well, leading to both re-absorption losses and colour changes.

In some cases, a close-packed conversion layer is desired. Close-packed QD conversion layers suffer from the phenomenon known as Fluorescence Resonant Energy Transfer (FRET), see e.g. Joseph R. Lakowicz, "Principles of Fluorescence Spectroscopy", $2^{nd}$ edition, Kluwer Academic/Plenum Publishers, New York, 1999, pp. 367-443. FRET occurs between a donor QD which emits at a shorter (e.g. bluer) wavelength relative to an acceptor QD positioned in close proximity and which emits at longer wavelength. There is a dipole-dipole interaction between the donor emission transition dipole moment and the acceptor absorption transition dipole moment. The efficiency of the FRET process depends on the spectral overlap of the absorption of the donor with the emission of the acceptor. The FRET distance between quantum dots is typically 10 nm or smaller. The efficiency of the FRET process is very sensitive to distance. FRET leads to colour change (red shift) and losses in the efficiency of light conversion.

Core/shell nanoparticles (NPs) are known. These are discrete nanoparticles characterized by a heterostructure in which a "core" of one type of material is covered by a "shell" of another material. In some cases, the shell is grown over the core which serves as a "seed", the core/shell NP known then as a "seeded" NP or SNP. The term "seed" or "core" refers to the innermost semiconductor material contained in the heterostructure. FIG. 1 show schematic illustrations of known core/shell particles. FIG. 1A illustrates a QD in which a substantially spherical shell coats a symmetrically located and similarly spherical core. FIG. 1B illustrates a rod shaped ("nanorod") SNP (RSNP) which has a core located asymmetrically within an elongated shell. The term nanorod refers to a nanocrystal having a rod-like shape, i.e. a nanocrystal formed by extended growth along a first ("length") axis of the crystal with very small dimensions maintained along the other two axes. A nanorod has a very small (typically less than 10 nm) diameter and a length which may range from about 6 nm to about 500 nm.

Typically the core has a nearly spherical shape. However, cores of various shapes such as pseudo-pyramid, cube-octahedron and others can be used. Typical core diameters range from about 1 nm to about 20 nm. FIG. 1C illustrates a QD in which a substantially spherical shell coats a symmetrically located and similarly spherical core. The overall particle diameter is $d_2$, much larger than the core diameter $d_1$. The magnitude of $d_2$ compared with $d_1$ affects the optical absorbance of the core/shell NP.

As known, a SNP may include additional external shells which can provide better optical and chemical properties such as higher quantum yield (QY) and better durability. The combination may be tuned to provide emitting colours as required for the application. The length of the first shell can range in general between 10 nm and 200 nm and in particular between 15 nm and 160 nm. The thicknesses of the first shell in the other two dimensions (radial axis of the rod shape) may range between 1 nm and 10 nm. The thickness of additional shells may range in general between 0.3 nm to 20 nm and in particular between 0.5 nm to 10 nm.

In view of the numerous deficiencies of QD conversion layers mentioned above, there is a need for and it would be advantageous to have conversion layers which do not suffer from such deficiencies. In particular, there is a need for and it would be advantageous to have nanoparticle-based thin conversion layers with negligible re-absorption (of both same and different colour), negligible clustering and high-loading effects and negligible FRET.

DEFINITIONS

The term "core material" to the semiconductor material from which the core is made. The material may be II-VI, III-V, IV-VI, or I-III-VI$_2$ semiconductors or combinations thereof. For example, the seed/core material may be selected from CdS, CdSe, CdTe, ZnS, ZnSe, ZnTe, ZnO, GaAs, GaP, GaAs, GaSb, HgS, HgSe, HgTe, InAs, InP, InSb, AlAs, AlP, AlSb, $Cu_2S$, $Cu_2Se$, $CuInS_2$, $CuInSe_2$, $Cu_2(ZnSn)S_4$, $Cu_2(InGa)S_4$, alloys thereof, and mixtures thereof.

The term "shell material" refers to the semiconductor material from which each of the non-spherical elongated shells is made. The material may be a II-VI, III-V IV-VI, or I-III-VI$_2$ semiconductor or combinations thereof. For example, the shell material may be selected from CdS, CdSe, CdTe, ZnS, ZnSe, ZnTe, ZnO, GaAs, GaP, GaAs, GaSb, GaN, HgS, HgSe, HgTe, InAs, InP, InSb, AlAs, AlP, AlSb, Cu$_2$S, Cu$_2$Se, CuInS$_2$, CuInSe$_2$, Cu$_2$(ZnSn)S$_4$, Cu$_2$(InGa)S$_4$, alloys thereof, and mixtures thereof.

The term "host matrix" refers to a material which incorporates the SNPs or other suitable nanoparticles. The host matrix may be a polymer (formed from liquid or semisolid precursor material such as monomer), an epoxy, silicone, glass or a hybrid of silicone and epoxy. Specific (but not limiting) examples of polymers include fluorinated polymers, polymers of ployacrylamide, polymers of polyacrylic acids, polymers of polyacrylonitrile, polymers of polyaniline, polymers of polybenzophenon, polymers of poly(methyl mathacrylate), silicone polymers, aluminium polymers, polymers of polybisphenol, polymers of polybutadiene, polymers of polydimethylsiloxane, polymers of polyethylene, polymers of polyisobutylene, polymers of polypropylene, polymers of polystyrene and polyvinyl polymers, polyvinyl-butyral polymers or perfluorocyclobutyl polymers.

The term "ligand" refers to an outer surface coating of the nanoparticles. The coating passivates the SNP to prevent agglomeration or aggregation to overcome the van der Waals binding force between the nanoparticles. Ligands in common use: phosphines and phosphine oxides such as trioctylphosphine oxide (TOPO), trioctylphosphine (TOP), tributylphosphine (TBP), phosphonic acids such as dodecylphosphonic acid (DDPA), tridecylphosphonic acid (TDPA), octadecylphosphonic acid (ODPA) or hexylphosphonic acid (HPA), amines such as dodecyl amine (DDA), tetradecyl amine (TDA), hexadecyl amine (HDA) or octadecyl amine (ODA), thiols such as hexadecane thiol or hexane thiol, mercapto carboxylic acids such as mercapto propionic acid or mercapto undecanoic acid and other acids such as myristic or palmitic acid.

SUMMARY

Embodiments of the invention disclose optical conversion layers (or simply "layers") incorporating at least one SNP species and/or other nanoparticles that have the needed characteristics rendering this layer with its unique optical properties. One such layer according to an embodiment of the invention is referred to henceforth as a "SNP conversion layer" or simply "SNP layer". References will be made henceforth also to "SNP sub-layers" representing part of a SNP layer, and to SNP multilayers, representing a structure with a plurality of SNP layers. Similar terms will be used for RSNP based layers with "SNP" replaced by "RSNP". To clarify, henceforth in this description, "layer" is equivalent to "conversion layer". Embodiments of the invention further disclose the application of SNP conversion layers for transforming light, particularly for conversion of LED monochromatic emission of short wavelength (e.g. blue or UV) to longer wavelengths in the VIS/NIR range to produce light of different colours. In particular, SNP layers of the invention may be used with one or more LEDs to provide a white light device with high energy efficiency and good optical properties such as high CRI (Colour Rendering Index) and desired CCT (correlated colour temperature). In other lighting applications, a SNP layer can provide a necessary and beneficial spectral output such as large gamut coverage, or specific colour bands.

In an embodiment, a SNP layer may include one type (species) of SNP emitting essentially at a single colour. In another embodiment, a SNP layer may include a mixture of several types of SNPs emitting at different colours. In some embodiments, a SNP layer may include SNPs incorporated in a host matrix, with or without ligands. A SNP layered structure may comprise several sub-layers, each of which may include a mixture of SNPs, or may include a different type of SNP.

In some embodiments, the SNP layer thickness may be equal to or thinner than 200 μm. In some embodiments, the SNP layer thickness may be equal to or thinner than 50 μm. In some embodiments, the SNP layer thickness may be equal to or thinner than 2 μm. In other embodiments, the SNP layer may have a thickness ranging between ca. 50 and 1000 nm.

In some embodiments, a SNP layer may include SNPs having a high-loading ratio within a polymer matrix, epoxy or resin. In some embodiments, the high-loading ratio may be up to 40%. In some embodiments, the high-loading ratio may be up to 80%. In some embodiments, the high-loading ratio may be up to 100%.

SNP conversion layers according to embodiments disclosed herein provide functionalities and advantageous properties which are unknown in QD conversion layers and which were not previously discovered. These include:

1) Negligible re-absorption (both same colour and different colour). The re-absorption in a SNP conversion layer is reduced significantly (in comparison to that in a QD conversion layer) because of low red absorbance. In general, re-absorption leads to loss of energy. For example, assume a typical QY of 0.8. In a single re-absorption event, the OY is reduced to 0.8×0.8=0.64. In two such events, the QY is reduced further to $0.8^3$=0.51. This loss is avoided in a SNP conversion layer. Hence, the efficiency is improved. Re-absorption also leads to a red shift, which is also avoided in such a SNP conversion layer. The aspect of negligible re-absorption is present not only for one colour on itself (e.g. red to more red), but also in green emitting SNPs or phosphors. Namely, with a QD conversion layer, red QDs will reabsorb green emission, leading to reduced efficiency and colour shift. With a SNP conversion layer, this re-absorption is minimized. Both same colour and different colour re-absorption avoidance functions are unique features of SNP layers, whether densely-packed or not.

2) Very efficient "funneling" of energy from blue excitation to red emission. An SNP conversion layer acts essentially as an "optical antenna" in the spectral sense. It performs this task much more efficiently that a regular QD conversion layer, since it has very high absorbance in the blue and strong red photoluminescence (PL) accompanied by minimal red re-absorption, see point (1) above.

3): FRET avoidance or minimalization. In a regular QD conversion layer, The typical length scale of FRET is ~10 nm, with $1/R^6$ dependence, where R is the distance between two QD particles. For example, if the initial emission QY is 0.8, the QY is reduced to 0.64 after a single FRET process. FRET also leads to red shift, which is avoided in a SNP layer. A densely-packed SNP conversion layer (with small distances between the SNPs, e.g. 0-50 nm) owing to their unique characteristics will avoid the losses and deficiencies related to FRET commonly encountered in densely-packed QD layers. Exemplarily, "densely-packed" as applied to SNPs in conversion layers of the invention may include ~85% SNPs and ~15% ligands dispersed in a host matrix.

In an embodiment, a SNP layer may be coated on an optical device such as a LED to improve its emission spectrum. In another embodiment, a separate SNP layer may be positioned in the optical path of light emitted by one or more LEDs for the same purpose. In yet another embodiment, a layered SNP structure comprising a plurality of different SNP conversion sub-layers may be coated on a LED. In yet another embodiment, the layered SNP structure may be positioned in the optical path of light emitted by LEDs. In some embodiments, a SNP layer may be spaced apart from a LED by a coupling layer which may be an air gap, an optical filter such as short wavelength (UV, blue) pass filter, a long wavelength (e.g. green or red) reflection filter, or an index matching layer which minimizes energy loss by reflection. The spacing between the LED and the SNP layer can for example be used to minimize heating due to heat flow from the LED to the SNP layer.

A combination of a LED and a SNP conversion layer or layered structure may be used in a lighting device (i.e. a domestic light, a signage light, a vehicle light, a portable light, a back light or any other light). In some embodiments, a lighting device may further comprise an optical element such as a lens, a waveguide, a scatterer, a reflective element, a refractive element or a diffractive element. The optical element may be placed between the SNP layer and the light source or before the SNP layer in the optical path, or on the sides of the layer (for example a reflective element for using scattered light). In some embodiments, the lighting device may include a combination of two or more optical elements from the list above in addition to a LED and one or more SNP layers.

BRIEF DESCRIPTION OF THE DRAWINGS

Non-limiting embodiments of the invention are herein described, by way of example only, with reference to the accompanying drawings, wherein.

DETAILED DESCRIPTION

Figure 1:
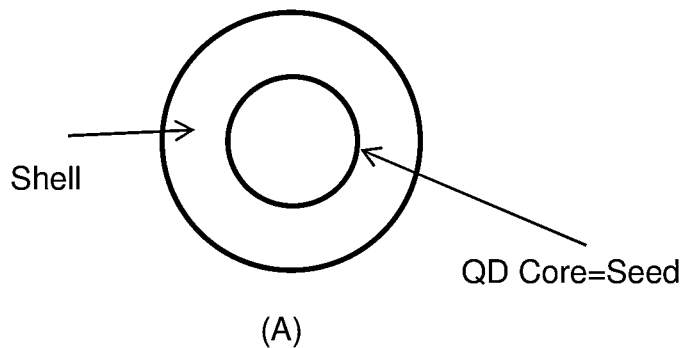
FIG. 1 is a schematic illustration of known core/shell particles: (A) core QD/shell QD; (B) RSNP; (C) SNP.
Figure 1:
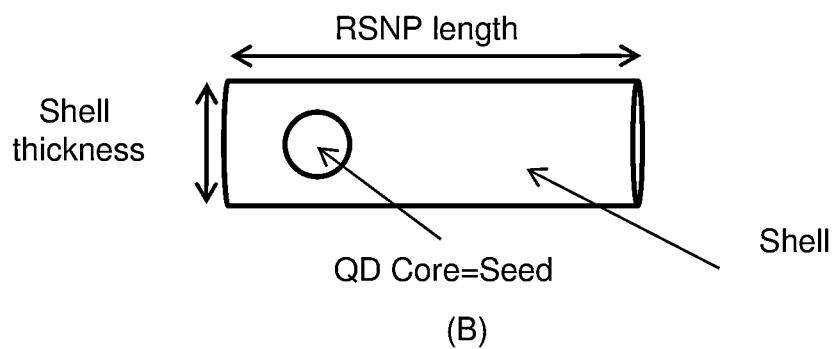
Figure 1:
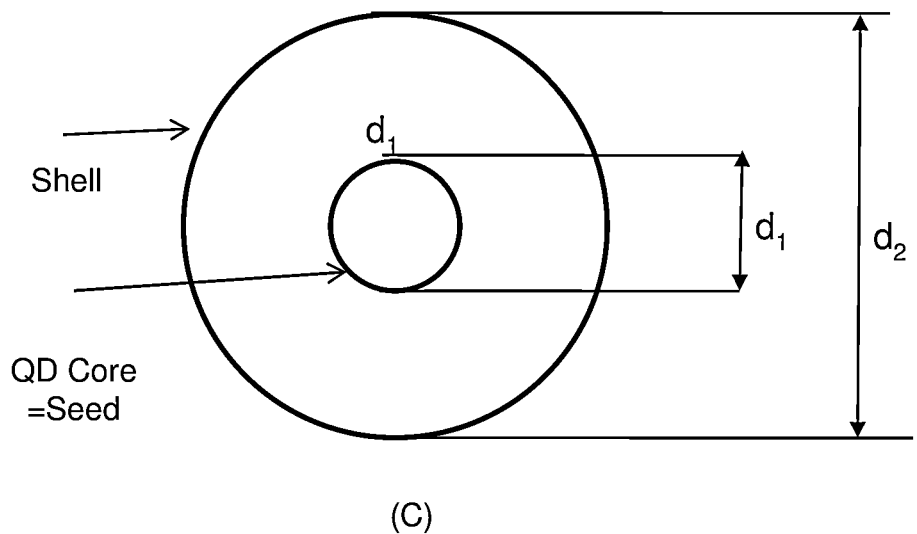
Figure 2:
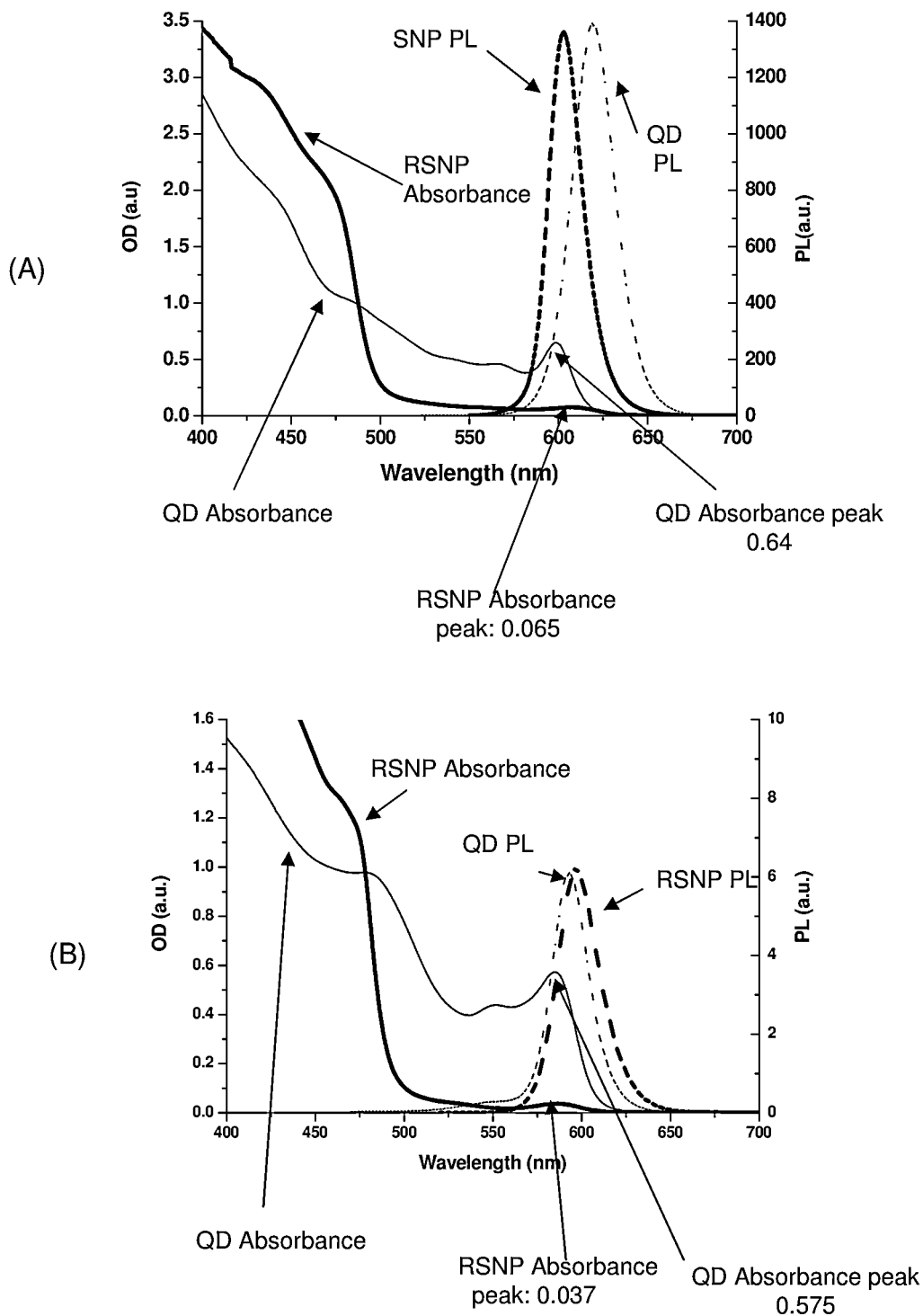
FIG. 2 shows experimental results of optical absorption and emission of a core/shell QD material vs. a RSNP material used in embodiments of the invention: (A) for green light; (B) for orange light.

Embodiments of SNP layers, SNP layers used to condition LED light and lighting devices including such layers are now described in more detail. In particular, advantageous properties and features of such layers are described next with reference to FIGS. 2-4. The various SNP layers mentioned below may be prepared using procedures detailed in Examples below.

Reference is now made to FIGS. 2A, B, which show a comparison between the absorption and emission of a known conventional CdSe/ZnS core/shell QD layer and two types of RSNP layers according to embodiments of the invention: a green emitting RSNP layer (FIG. 2A) and an orange emitting RSNP layer (FIG. 2B). The comparison is between the absorption and normalized emission of the QD layer vs. the SNP layers having a matched absorption at the excitation wavelength of 450 nm. The Green RSNP layer included CdSe/CdS core/shell RSNPs with dimensions 4×27 nm (diameter×length), emitting at a center wavelength (CWL) or peak wavelength of 540 nm with a full width half maximum (FWHM) of 29 nm. The Orange RSNP layer included CdSe/CdS RSNPs with dimensions 5×40 nm, a CWL at 600 nm and FWHM of 28 nm. Both Orange and Green emitting layers were prepared in a similar way, and both were 190 μm-thick, with diameter of 42 mm.

The PL quantum yield (QY) of both QD and RSNP nanoparticles was similar and on the order of 50%. This is a typical value. In other prepared samples, the QY ranged from 5-100%, more often between 20-90% and even more often between 50-80%. The absorption is measured in relative optical density (OD) units, where the scale shown is normalized to the range [0 1] for convenience. Significantly, for the green light emitting layers in FIG. 2A, the OD of the QD layer in the emission wavelength range (e.g. 520-550 nm) is 10 times higher than that of the RSNP layer (0.64 vs. 0.065). The OD difference for the orange emitting layers in FIG. 2B is even higher (0.575 vs. 0.037, a factor of ~15). In other examples (not shown), the OD in the emission range of a QD layer was found to be 3-30 times higher than that of a RSNP layer. Therefore, losses due to self-absorbance are significant for the QD layer case and negligible for the RSNP layer case. This property is used in various SNP layers of the invention (whether densely-packed or not) to provide far superior products over existing layers based on quantum dots.

The inventors have further determined that SNP layers of the invention have a feature of very efficient "funneling" of energy from blue excitation to red emission. An SNP layer acts essentially as an "optical antenna" in the spectral sense. It performs this task much more efficiently that a regular QD layer, since it has very high absorbance in the blue and strong red PL accompanied by minimal red re-absorption, see FIG. 3.

Figure 3:
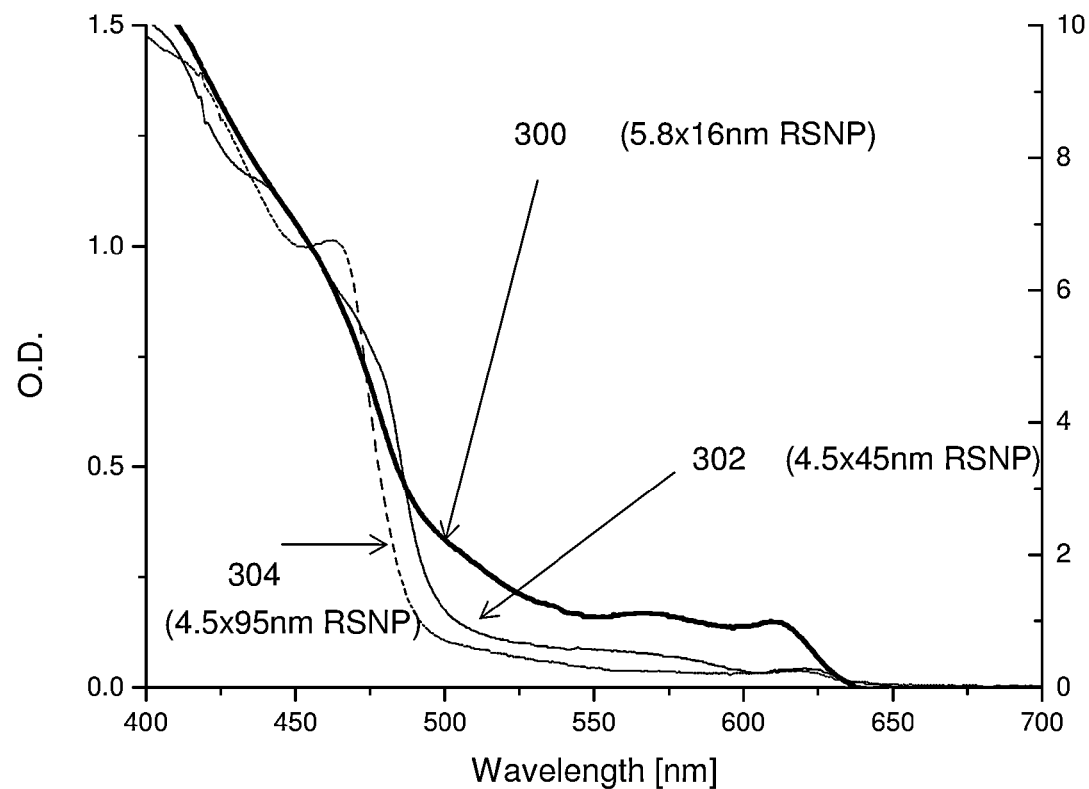
FIG. 3 shows normalized absorption curves of three types of red emitting SNPs having different lengths.

FIG. 3 shows normalized absorption curves of three types of RSNP layers prepared as described in Example 1 below and comprising in each case red emitting RSNPs (CdSe/CdS) having different overall dimensions and nearly similar emission spectra: a curve 300 for 5.8×16 nm RSNPs with 622 nm emission, a curve 302 for 4.5×45 nm RSNPs with 625 nm emission and a curve 304 for 4.5×95 nm RSNPs with 628 nm emission. These curves illustrate the funneling effect in different conversion layers. The absorption curves are normalized to OD 1 at 455 nm. The "absorption ratio" between absorption at 455 nm to that at the emission wavelengths is respectively 1:5, 1:12 and 1:23 for SNP layers with RSNPs of lengths 16, 45 and 95 nm. This shows that the funneling is more efficient for layers comprising longer RSNPs and that the absorption ratio is "tunable" by varying the RSNP length. Note that for SNPs which are not rod-shaped, a similar tuning can be achieved by increasing the shell to core diameter ratio. This tunability is very useful in SNP layers since it allows the SNP layers to act as the efficient spectral antenna to convert blue light to red light desired in a light source and application. An additional parameter resulting from this special characteristic of SNP layer is that it allows to efficiently balance the light between the different spectral regions of the visible spectrum (say green-yellow emitted by CE:YAG and the red emitted by SNPs) to obtain light with required characteristic (such as CCT and CRI).

Figure 4:
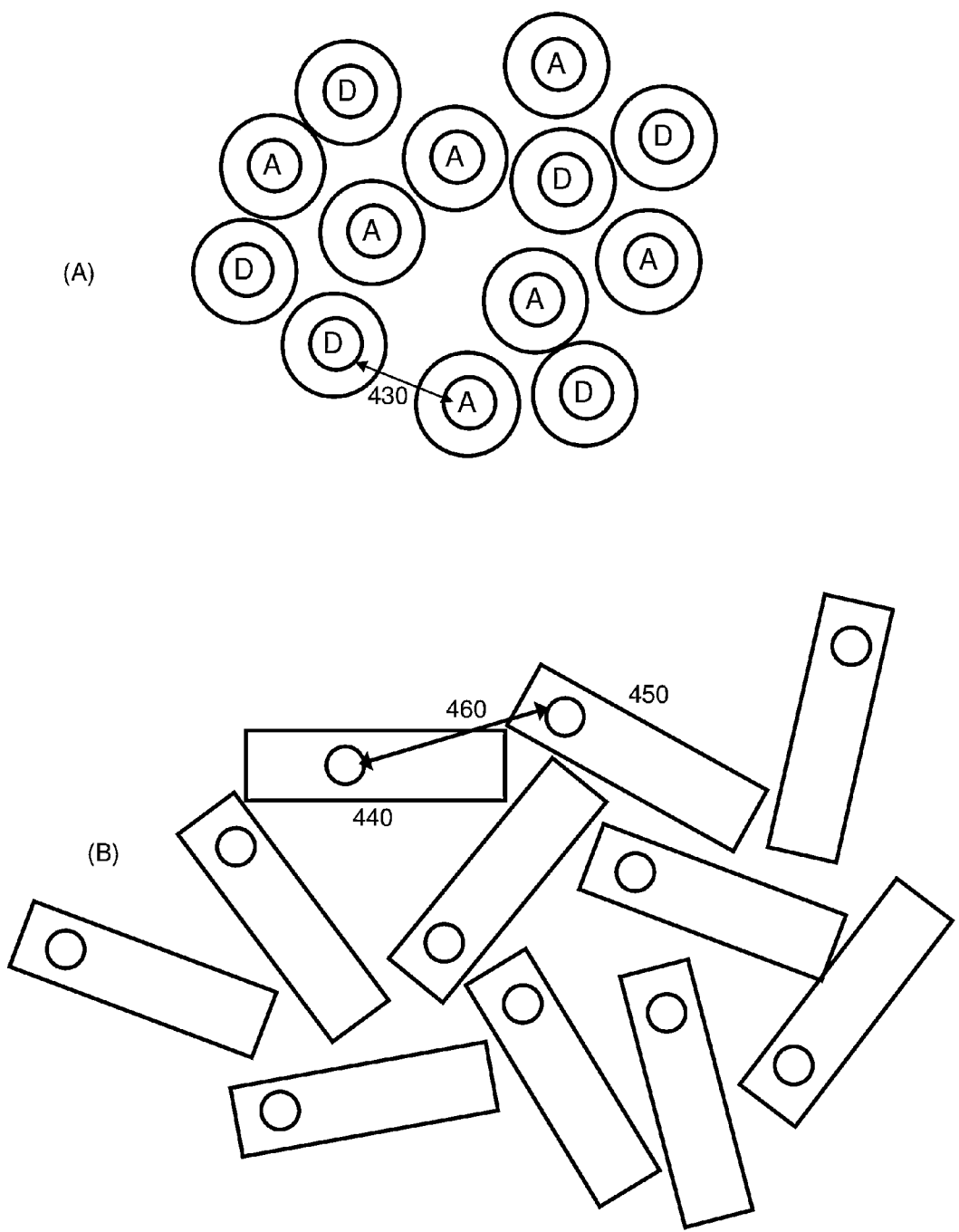
FIG. 4 illustrates schematically the FRET effect in densely-packed QDs, in which it is efficient, and in densely-packed RSNPs, in which it is blocked.

The inventors have further determined that layers with densely-packed SNPs have significantly smaller FRET losses than layers having densely-packed QDs. FIG. 4 illustrates schematically the FRET effect in densely-packed conversion layers of QDs and RSNPs. FIG. 4A, for the QD conversion layer case, shows some QDs acting as donors (D, 410) and some acting as acceptors (A, 420), with a typical distance between donor and acceptor denoted by the arrow 430. In such a typical QD conversion layer, the smaller QDs act as donors to larger QDs which act as acceptors. The typical center-to-center distance is on the order of the FRET distance of ~10 nm, hence FRET is efficient in such a densely-packed QD conversion layer. FIG. 4B, for the SNP layer case, shows that the special geometry induces on average large distances between a RSNP 440 emitting a colour slightly bluer as compared to another RSNP 450. The typical core-to-core distance in this case (indicated by 460) is around half of the RSNP length, and is engineered to exceed the FRET distance, leading to a significantly reduced probability for FRET processes.

To reiterate, known QDs do not provide such a large distance and consequently, in a densely-packed layer arrangement, their FRET losses are inherent, leading to reduced conversion efficiency. In addition, in a densely-packed QD conversion layer, the FRET process leads to a red shift of the emission. In contrast, in a SNP layer as disclosed herein, the emission is maintained at the tailored and desired wavelength, providing the required colour and higher energy efficiency.

To reemphasize, the optical properties of the SNP layers of the invention provide significant advantages over existing QD conversion layers due to low re-absorption and small energy transfer losses and light colour changes. The capability to minimize re-absorption implies that higher absorption (by longer optical paths and/or higher concentration of the SNP) may be used. As a result, significant absorption of the blue or UV LED light may be achieved and higher efficiency devices are enabled, exemplified by the spectral antenna characteristic of the SNP conversion layers disclosed herein.

In known QD conversion layers, the formation of clusters of QD material may lead to energy losses via FRET, as described above. Clustering can occur even at low loading, while high loading can occur without dense packing (the latter correlated with extremely high loading). Since QDs are densely-packed in a cluster, the distance between neighbouring QDs is small and energy transfer processes may become significant. These will reduce the emission output and the efficiency of the devices and will also affect the light colour output. SNP clustering in a conversion layer does not lead to energy transfer losses, and therefore losses in efficiency or changes in the light colour output are avoided. Therefore, devices based on SNP will function even if clusters are formed. This enables the use of thinner layers.

Known QD materials for light conversion are embedded in a host material (matrix) in a low-loading ratio to avoid losses by mechanisms such as by FRET. As a result, a QD conversion layer must be thick (typically thicker than 100 μm in most cases), yet still contain sufficient amount of material to achieve effective absorption of blue light for conversion, thereby inherently leading to re-absorption losses. In addition, for thick layers, manufacturing methods become less accurate and more resource consuming. In sharp contrast, high-loading ratio SNP layers may be made very thin. For example, thin SNP layers may be produced using spin-coating deposition techniques, see Examples 4 and 5 in which the layers are respectively 510 nm and 230 nm-thick. In general, for SNP/RSNP conversion layers of the invention, absorption and emission can be controlled to provide tailored colour and optical characteristics, power and efficiency. Densely-packed, high-loading thin SNP layers have an additional advantage in that they may be made with excellent uniformity over large length scales, from a few millimeters to centimeters and even more.

High-loading ratio SNP layers may be prepared using a polymer, epoxy or resin matrix, or simply by having a layer of close-packed SNPs. The polymer or additive may serve additional purposes such as for encapsulating the optically active nanoparticles to prevent oxidation or photo-degradation, serve as a medium easy for mechanical integration in the lighting device and as a medium which can also enhance the light extraction from the layer due to its refractive index and surface roughness. A host material (matrix) can also serve as a matrix for diffusive particles such as $SiO_2$, Al, $BaSO_4$ or $TiO_2$, which can enhance the scattering within the layer. The loading ratio may be used to control the refractive index of the SNP layer. Layers of low-loading ratio may have a refractive index as low as 1.5 and even lower, while layers with a high-loading ratio may have a refractive index of 1.8 and even higher. Typically, for polymers with a refractive index of 1.3-1.5, the refractive index will not change up to ~15% loading ratio. Typically, with ligands, the refractive index may be 1.8 and more.

Tables 1-3 summarize various exemplary embodiments of SNP/RSNP conversion layers made according to the invention. Other embodiments of conversion layers having advantageous physical parameters and optical performance are possible and can be made according to the teachings disclosed herein. Therefore, these exemplary embodiments should not be considered as limiting the invention in any way.

TABLE 1

Parameters for Red-emitting RSNP conversion layers

| Conversion layer/RSNP type | Embedding material | SNP length [nm] | Emission [nm] | Layer Thickness [µm] | $AR^a_{red}$ | $AR^b_{green}$ | $OD^c$ | PL Red Shift$^d$ [nm] |
|---|---|---|---|---|---|---|---|---|
| CdSe\CdS ZnSe\CdS CdSe\CdS\ZnS CdSe\CdZnS CdSe\CdZnS\ZnS | Ligands$^e$ | 8-150 | 580-680 | 0.1-2 | For RSNP length 8-100 nm, AR > 3.5:1 For RSNP length 60-150 nm, AR > 7:1 | For RSNP length 8-110 nm, AR > 2.5:1 For RSNP length 60-100 nm, AR > 6:1 | 0.07-2.0 | <5 |
| CdSe\CdS ZnSe\CdS CdSe\CdS\ZnS CdSe\CdZnS CdSe\CdZnS\ZnS | Polymer$^f$ or Silicone$^g$ | 8-150 | 580-680 | 1-5000 | For SNP length 8-100 nm, AR > 3.5:1 For RSNP length 60-150 nm, AR > 7:1 | For RSNP length 8-110 nm, AR > 2.5:1 For RSNP length 60-100 nm. AR > 6:1 | 0.07-2.0 | <5 |

Markings in Table 1:
$^a$ $AR_{red}$ is the ratio between the absorbance at 455 nm to the maximal absorbance in a wavelength range between 580-700 nm, i.e. $AR_{red}$ = (Absorbance$_{455\ nm}$/max(Absorbance$_{580-700\ nm}$);
$^b$ $AR_{green}$ is the ratio between the absorbance at 455 nm to the maximal absorbance in a wavelength range between 520-580 nm, i.e. $AR_{green}$ = (Absorbance$_{455\ nm}$/max(Absorbance$_{520-580\ nm}$);
$^c$ OD is measured at 455 nm;
$^d$ PL Red shift is the difference in nanometers between the CWL measured in Toluene at low OD (<0.1) and the CWL measured for the sample;
$^e$ Ligands can be selected from list given in definitions;
$^f$ The polymer can be selected from list given in definitions;
$^g$ Silicone with suitable optical and mechanical properties can be selected from various commercial suppliers.

TABLE 2

Parameters for Green-emitting RSNP conversion layers

| Conversion layer/RSNP type | Embedding material | SNP length [nm] | Emission [nm] | Layer Thickness [µm] | $AR^a_{green}$ | $OD^b$ | PL Red Shift$^c$ [nm] |
|---|---|---|---|---|---|---|---|
| CdSe\CdS ZnSe\CdS CdSe\CdS\ZnS CdSe\CdZnS CdSe\CdZnS\ZnS | Ligands$^d$ | 8-150 | 520-580 | 0.1-5 | For RSNP length 8-100 nm, AR > 3.5:1 For RSNP length 45:150 AR > 7:1 | 0.07-2.0 | <5 |
| CdSe\CdS ZnSe\CdS CdSe\CdS\ZnS CdSe\CdZnS CdSe\CdZnS\ZnS | Polymer$^e$ or Silicone$^f$ | 8-150 | 520-580 | 1-10 | For RSNP length 8-100 nm, AR > 3.5:1 For RSNP length 45:150, AR > 7:1 | 0.05-2.0 | <5 |

Markings in Table 2:
$^a$ $AR_{green}$ is the ratio between the absorbance at 455 nm to the maximal absorbance in a wavelength range between 520-580 nm, i.e. $AR_{green}$ = (Absorbance$_{405\ nm}$/max(Absorbance$_{520-580\ nm}$);
$^b$ OD is measured at 405 nm;
$^c$ PL Red shift is the difference in nanometers between the CWL measured in Toluene at low OD (<0.1) and the CWL measured for the sample;
$^d$ Ligands can be selected from list given in definitions;
$^e$ The polymer can be selected from list given in definitions;
$^f$ Silicone with suitable optical and mechanical properties can be selected from various commercial suppliers.

TABLE 3

Parameters for Green-and Red-emitting SNP conversion layers

| Conversion layer/ SNP type | Embedding material | Emission [nm] | Layer Thickness [μm] | $AR^a_{green}$ | $AR^b_{red}$ | $OD^c$ | PL Red Shift$^d$ [nm] |
|---|---|---|---|---|---|---|---|
| CdSe\CdS<br>ZnSe\CdS<br>CdSe\CdS\ZnS<br>CdSe\CdZnS<br>CdSe\CdZnS\ZnS | Ligands$^e$ | 580-680 | 0.1-5 | | AR > 3:1 | 0.07-2.0 | <5 |
| CdSe\CdS<br>ZnSe\CdS<br>CdSe\CdS\ZnS<br>CdSe\CdZnS<br>CdSe\CdZnS\ZnS | Polymer$^f$ or Silicone$^g$ | 580-680 | 1-10 | | AR > 3:1 | 0.05-2.0 | <5 |
| CdSe\CdS<br>ZnSe\CdS<br>CdSe\CdS\ZnS<br>CdSe\CdZnS<br>CdSe\CdZnS\ZnS | Ligands$^e$ | 520-580 | 0.1-5 | AR > 3:1 | | 0.07-2.0 | <5 |
| CdSe\CdS<br>ZnSe\CdS<br>CdSe\CdS\ZnS<br>CdSe\CdZnS<br>CdSe\CdZnS\ZnS | Polymer$^f$ or Silicone$^g$ | 520-580 | 1-10 | AR > 3:1 | | 0.05-2.0 | <5 |

Markings in Table 3:
$^a$$AR_{green}$ is the ratio between the absorbance at 405 nm to the maximal absorbance in a wavelength range between 520-580 nm, i.e. $AR_{green}$ = (Absorbance$_{405\,nm}$/max(Absorbance$_{520-580\,nm}$);
$^b$$AR_{red}$ is the ratio between the absorbance at 455 nm to the maximal absorbance in a wavelength range between 580-680 nm, i.e. $AR_{red}$ = (Absorbance$_{455\,nm}$/max(Absorbance$_{580-680\,nm}$);
$^c$OD is measured at 455 nm for nanoparticles emitting at 580-680 nm and at 405 nm for nanoparticles emitting at 520-580 nm;
$^d$PL Red shift is the difference in nanometers between the CWL measured in Toluene at low OD (<0.1) and the CWL measured for the sample;
$^e$Ligands can be selected from list given in definitions;
$^f$The polymer can be selected from list given in definitions;
$^g$Silicone with suitable optical and mechanical properties can be selected from various commercial suppliers.

Figure 5:
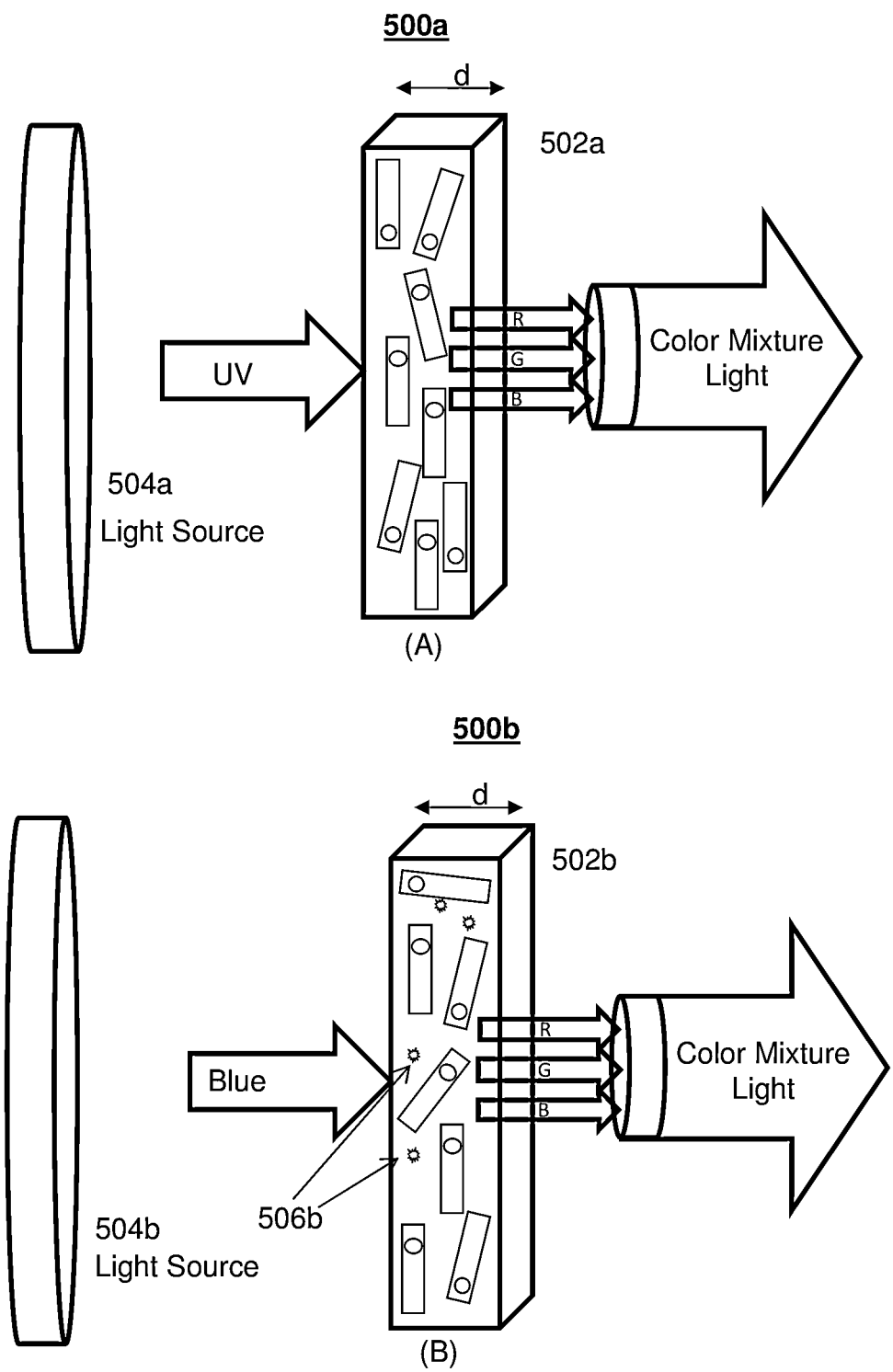
FIG. 5A shows schematically a light conversion device which includes a SNP layer according to one embodiment of the invention.
FIG. 5B shows schematically a light conversion device which includes a SNP layer according to another embodiment of the invention.

FIG. 5A shows schematically a lighting device 500a which includes a SNP layer 502a according to one embodiment of the invention. Light produced by a suitable source 504a (exemplarily a LED emitting UV light) is directed at SNP layer 502a. Layer 502a comprises SNPs that convert the light from blue and/or UV to longer wavelengths. Different populations (types) of SNPs (having different cores or shell sizes or materials) will emit different colours. The colours emitted by the SNP layer may be combined with the light produced by source 504a or used independently to form different light combinations. In order to improve and tune the spectral properties of the emission, more than one type of SNPs can be used, e.g. mixtures of blue, green and red emitting SNPs (their light exemplarily marked RGB). The various colours may be chosen so as to provide white light. Other colour combinations, as desired for a specific lighting application, can be generated by tailoring the SNP conversion layer.

FIG. 5B shows schematically a lighting device 500b which includes a SNP layer 502a according to another embodiment of the invention. In this embodiment, light produced by a suitable source 504b (exemplarily a LED emitting blue light) remains partially un-converted (i.e. passes through unaffected) by a SNP layer 502b. Layer 502b incorporates SNPs that convert the light from blue and shorter wavelengths to green and red. Layer 502b further incorporates diffusive structures or particles that spread and mix the unabsorbed light in a tailored pattern, to conform with the spatial and optical characteristics of the photoluminescence of the SNPs incorporated therein. That is, these structures scatter both the incoming blue light and the SNP-emitted light such that the combined light has the same angular diversion when it exits the SNP layer as a "white" light. In addition, the white has high quality green and red light added to the LED blue light to provide a large colour gamut for a display backlight.

Figure 6:
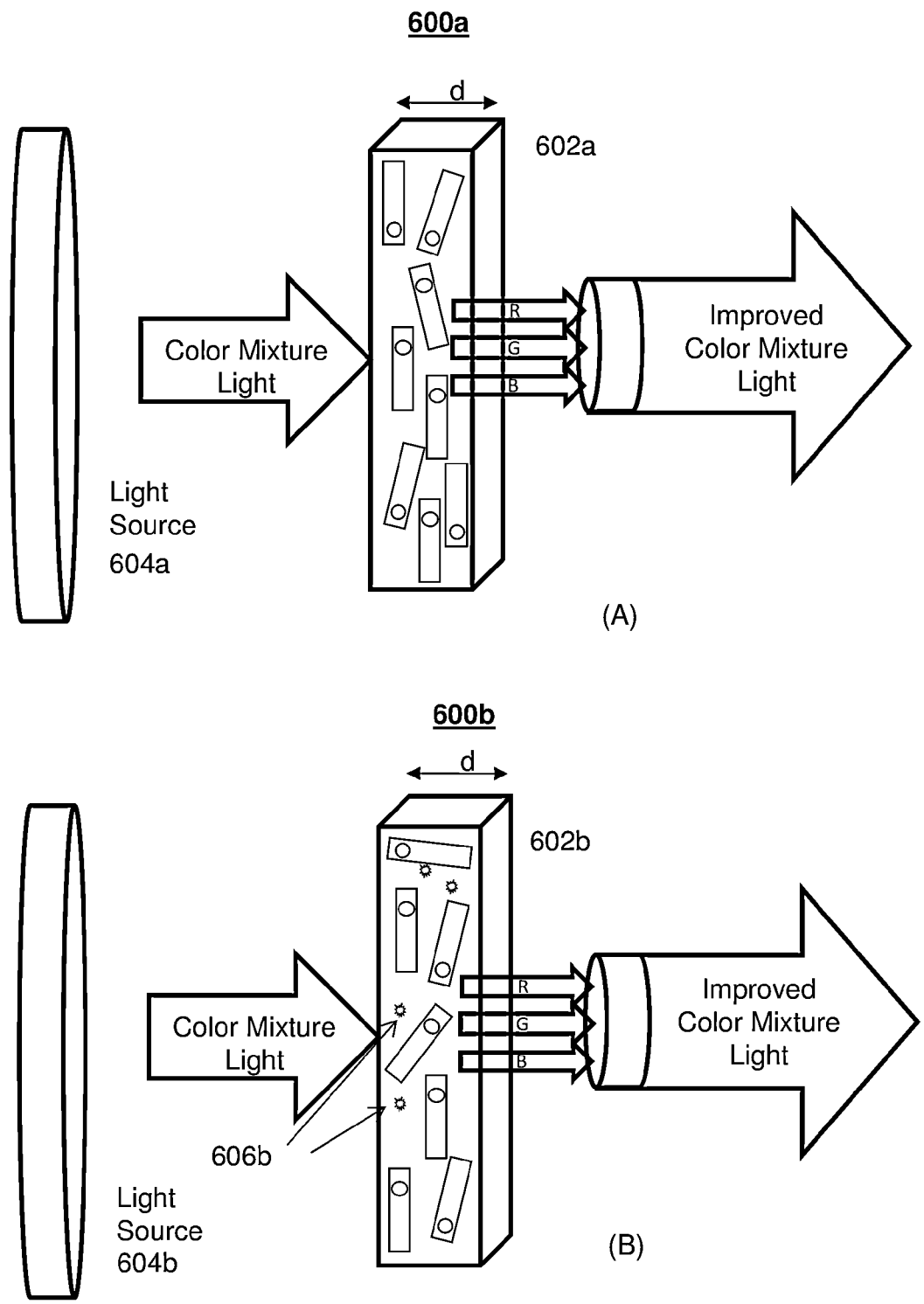
FIG. 6A shows schematically a light conversion device which includes a SNP layer according to yet another embodiment of the invention.
FIG. 6B shows schematically a light conversion device which includes a SNP layer according to yet another embodiment of the invention.

FIG. 6A shows schematically a lighting device 600a which includes a SNP layer 602a according to yet another embodiment of the invention. In this embodiment, a "colour mixture light" source 604a is improved or corrected by SNP layer 602a. Layer 602a includes a plurality of SNP species which may have different cores or shell sizes, different materials and/or different spectral properties. The SNPs act to convert the colour mixture light source into an improved colour mixture light. In an embodiment, the improved colour mixture light output from the lighting device can be "white light" with a CCT in the range of 2500-6000K with high CRI. In another embodiment, the improved colour mixture light can be white light with a CCT in the range of 2700-4500K range with high CRI. The source light may be white light with high CCT (for example 5000-10000K). Alternatively, it may be a light combination which cannot be defined as white light but which includes light in the range of the visible spectrum. The improvement includes for example addition of red light to the emission, thereby providing a lower CCT and better CRI.

FIG. 6B shows schematically a light conversion device 600b which includes a SNP layer 602b according to yet another embodiment of the invention. In this embodiment, layer 602b includes, in addition to a plurality of SNP species such as in layer 602a, diffusive structures or particles that spread and mix the un-absorbed light from source 604b in a tailored pattern to produce a further improved colour mixture light.

In alternative embodiments, the lighting device can include several SNP layers, each providing a separate function, may be used instead of a single SNP layer. Scattering and controlling the transmission characteristics (e.g. homogenization) of transmitted and emitted light may be achieved by incorporating in one or more of the SNP conversion layers either refractive particles such as small $SiO_2$ beads or reflective particles such as metal particles or light diffusing particles such as $BaSO_4$ and $TiO_2$ by adding a patterning (e.g. diffusive) layer, or by patterning the surface of at least one of the layers.

Figure 7:
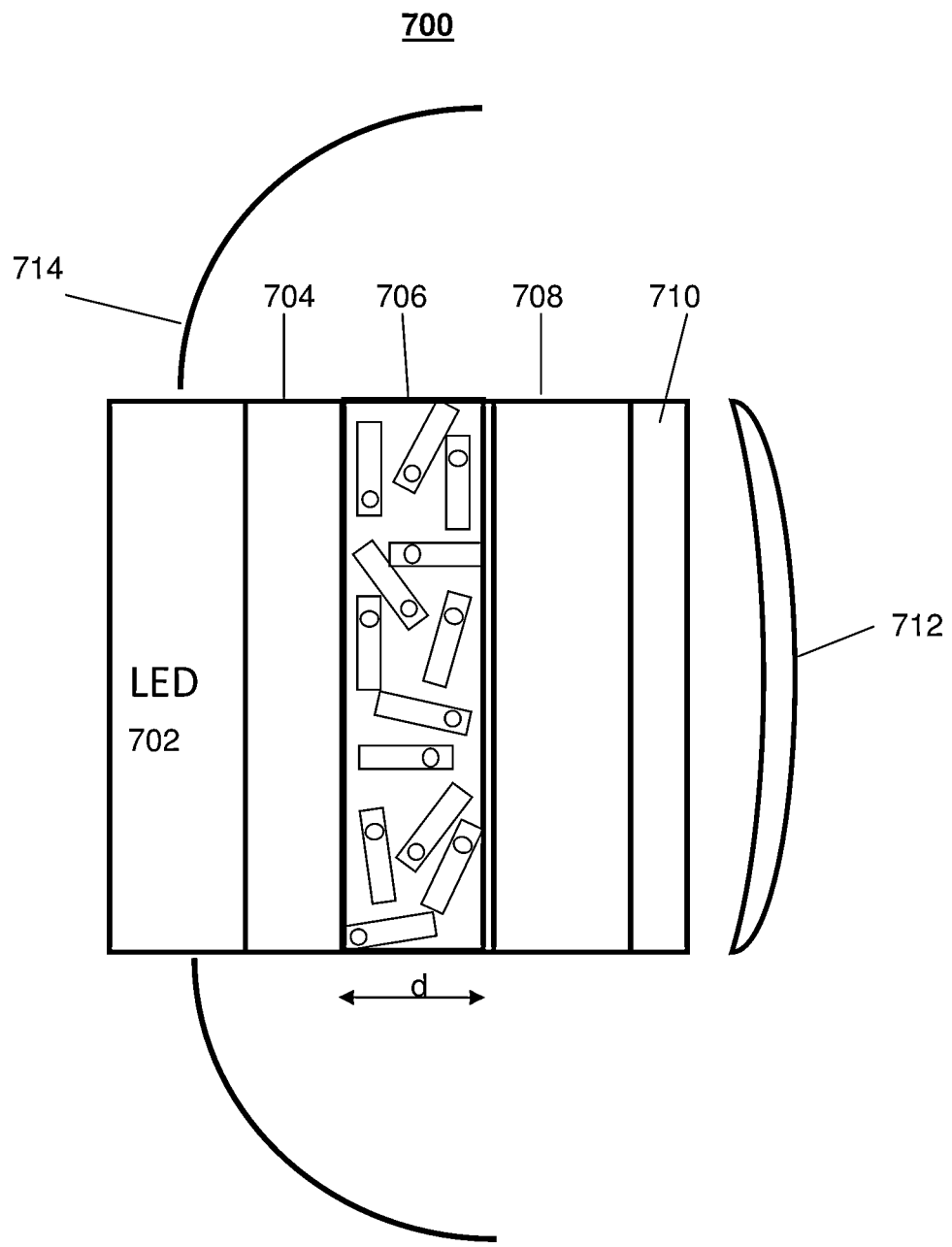
FIG. 7 shows schematically a lighting device which includes a SNP layer according to an embodiment of the invention.

FIG. 7 shows schematically a lighting device 700 which includes a SNP conversion layer according to an embodiment of the invention. Device 700 includes a blue or UV LED light source, an optional spacer layer (or air as spacer) 704, a SNP conversion layer 706, an optional encapsulation layer 708, an optional transmissive optical element 710 for light extraction to desired directionality, an optional refractive element such as a lens 712 to collimate or focus the light, and an optional reflective element 714 placed behind and around the LED element to collect and direct emission from large angles to the correct output direction. In some embodiments, the high refractive index of a SNP layer with a high-loading ratio is preferred in order to increase the light extraction from the LED chip.

Figure 8:
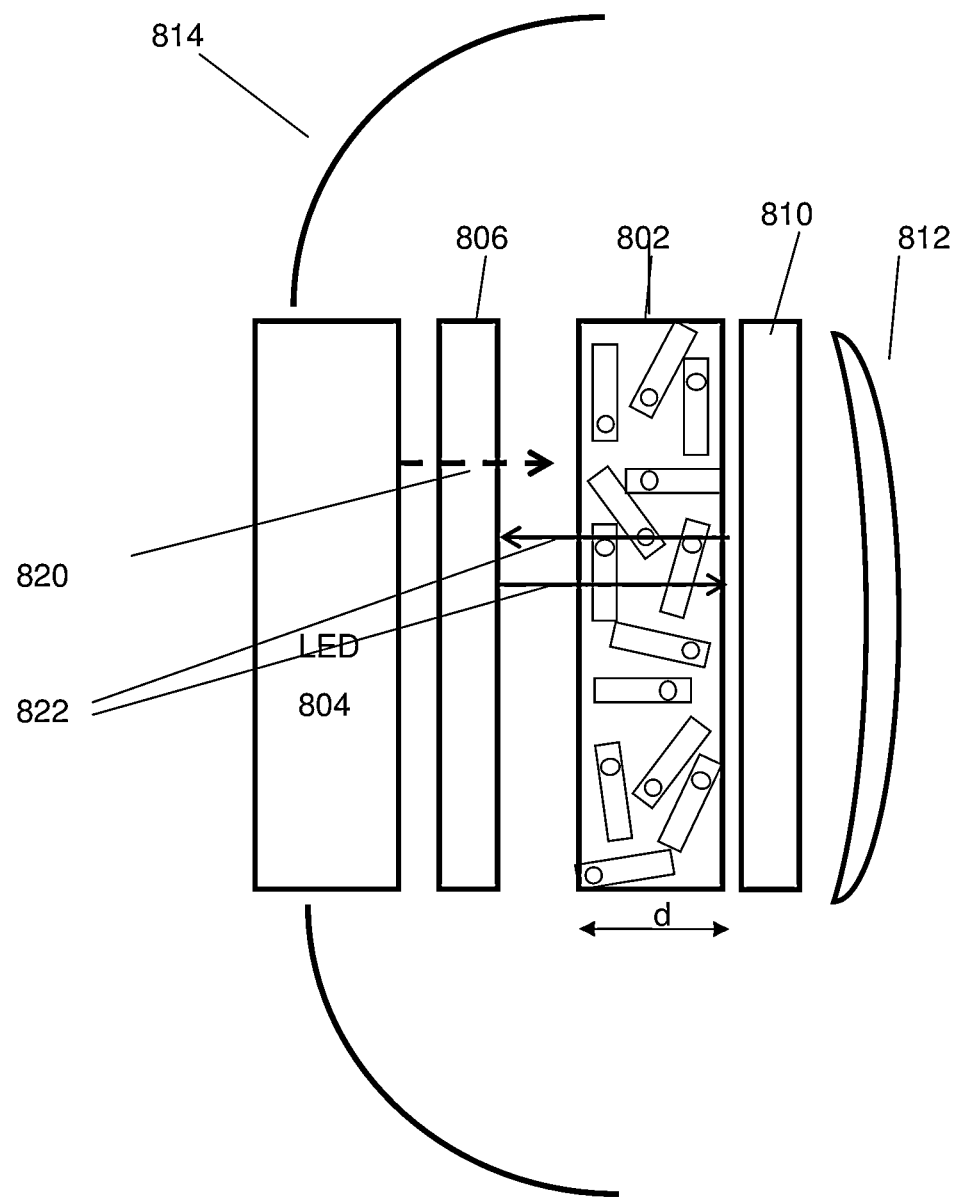
FIG. 8 shows schematically a lighting device which includes a SNP layer according to another embodiment of the invention.

FIG. 8 shows schematically a lighting device 800 which includes a SNP layer according to another embodiment of the invention. In device 800, an optical filter 806 is between a SNP layer 802 and a LED emitting chip 804. Optical filter 806 is a filter which transmits short wavelength 820 (e.g. blue or UV) light and reflects longer wavelength (e.g. green or red) light 822, thereby enabling light recycling and a more efficient device. While the light recycling increases the optical path of the emitted light in the SNP layer, due to the low self-absorbance, any extra loss would be minimized. In contrast, with a QD layer, the extra loss will be significant. Optical elements between the light source and the SNP layer may also be used to shape or otherwise control the light source characteristics. Like device 700, device 800 further comprises an optional transmissive optical element 810 for light extraction to desired directionality, an optional refractive element such as a lens 812 to collimate or focus the light, and an optional reflective element 814 placed behind and around the LED element to collect and direct emission from large angles to the correct output direction. Placing the SNP layer at a distance from the LED element can diminish the light intensity at the SNP layer and the temperature level thereby increasing its durability.

Figure 9:
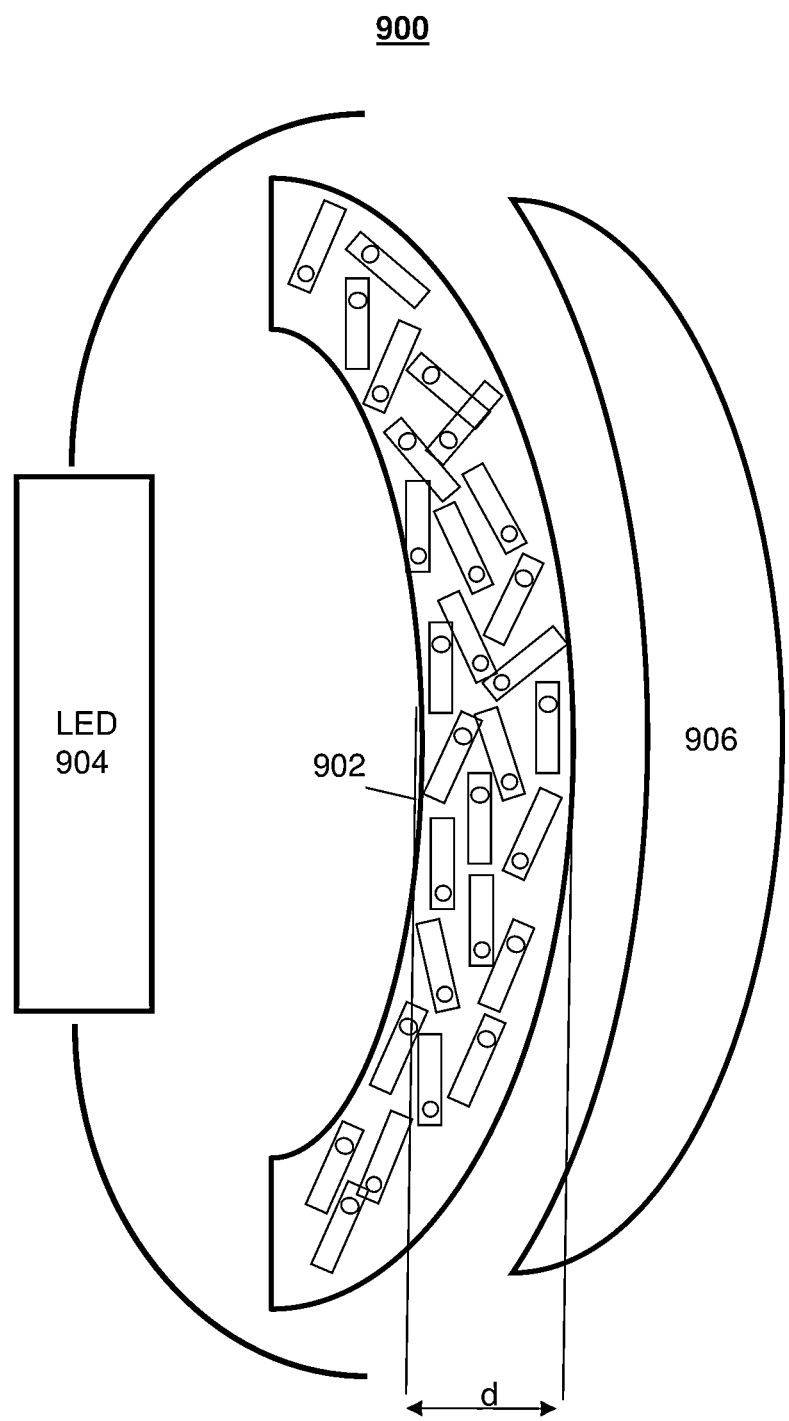
FIG. 9 shows schematically a lighting device which includes a SNP layer according to yet another embodiment of the invention.

FIG. 9 shows schematically a lighting device 900 which includes a SNP layer according to yet another embodiment of the invention. Device 900 includes a SNP layer shaped to fit in a curved optical element 902, serving to colour convert and also to diffuse the light, a LED 904 and additional layers 906 used for example for spatial patterning or optical filtering (e.g. additional UV filtering). SNP layers can be thin yet efficient, which represents a significant advantage over the performances of thick QD conversion layers.

Figure 10:
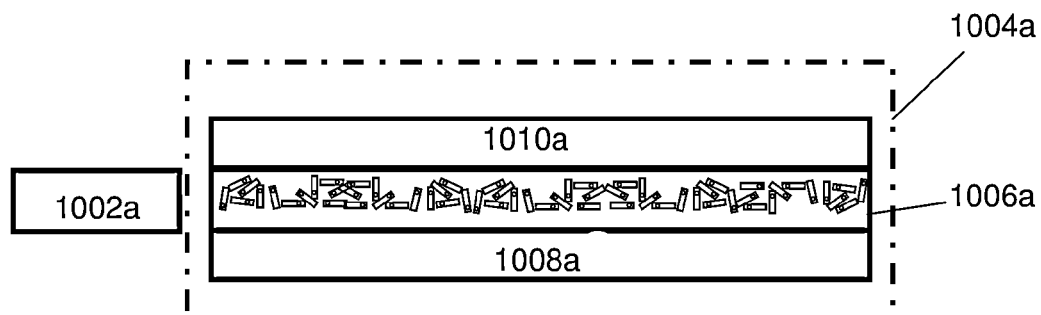
FIG. 10A shows a LED coupled to a waveguide that has an SNP layer embedded therewithin.
FIG. 10B shows schematically a LED coupled to a waveguide that has an SNP layer positioned on a top surface thereof.
Figure 10:
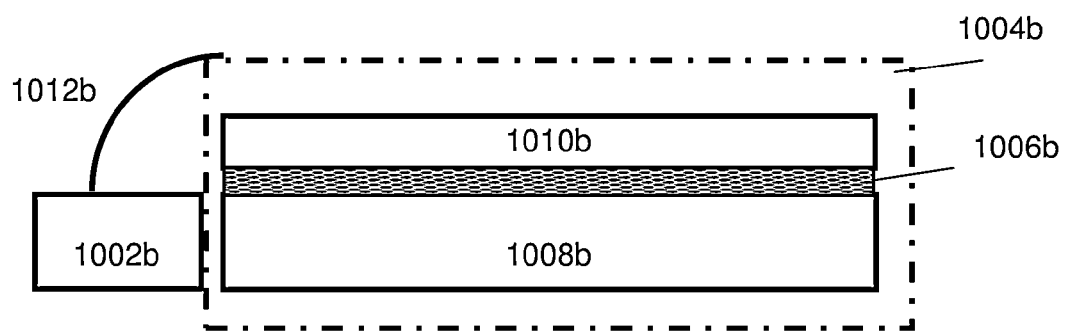

FIG. 10A shows a LED 1002a coupled to a waveguide assembly 1004a that has an SNP layer 1006a embedded therewithin. The waveguide includes a reflecting layer at a bottom 1008a (which may be diffusive or reflective, patterned or homogenous) and an optional light extraction layer 1010a. FIG. 10B shows schematically a LED 1002b coupled to a waveguide assembly 1004b that has an SNP layer 1006b positioned on a top surface 1008 thereof and an optional light extraction layer 1010b. In both embodiments, the SNP layer is shown excited by light coming from emitted by the LED through an edge 1012a or 1012b of the waveguide. As light propagates in the waveguide, it passes through the SNP layer again and again. Light converted in the SNP layer is then transmitted across the waveguide over a relatively great distance, which can be in the millimeters to centimeters to tens of centimeters range. In this application, the low self-absorbance of the SNP layer may be critical, since the light travels over a long optical path. The reflective and/or diffusive optical elements (1008a, 1008b 1010a, 1010b and 1012b) may be placed at all areas of the device where the light can be emitted not in the needed direction. These elements will return the light into the waveguide and increase its efficiency

EXAMPLES

Example 1

Lighting Device with RSNP Conversion Layer within Polymer Host Providing Red Light RSNPs were synthesized following similar procedures to those described in L. Carbone et al. "Synthesis and Micrometer-Scale Assembly of Colloidal CdSe/CdS Nanorods Prepared by a Seeded Growth Approach" Nano Letters, 2007, 7 (10), pp 2942-2950. In a first step, CdSe cores with diameter of 3.8 nm were synthesized. In a second step, red emitting CdSe/CdS RSNPs were synthesized using the CdSe cores as seeds. The resulting RSNPs had dimensions of 33×7 nm with an emission maximum is at 635 nm with FWHM of 30 nm when measured in a Toluene solution.

Figure 11:
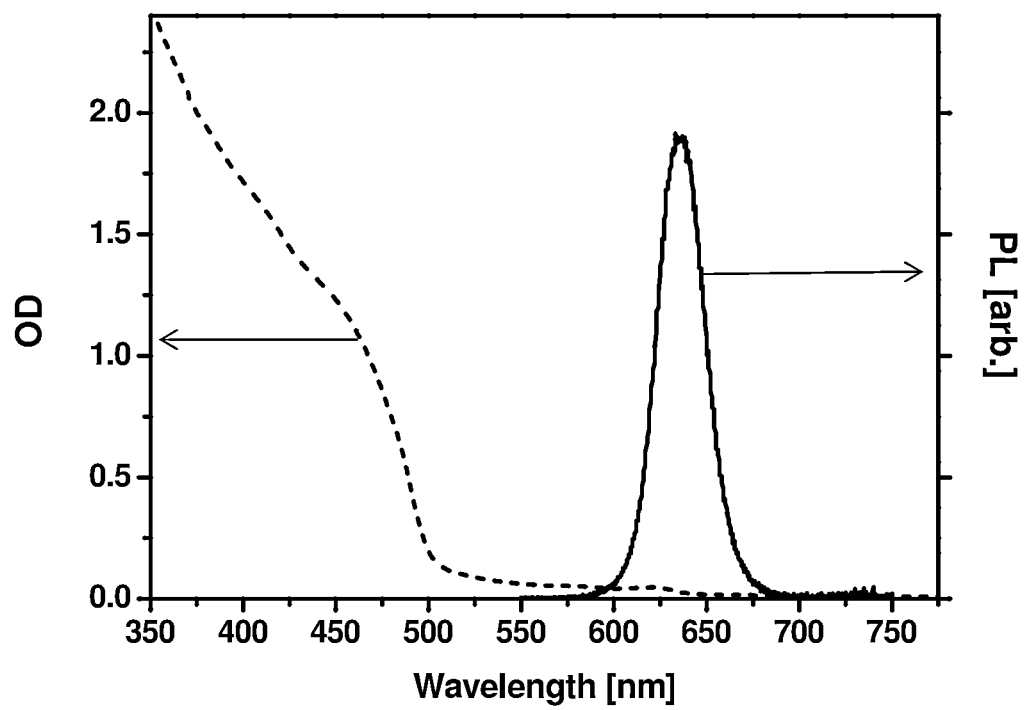
FIG. 11 shows the absorption (dotted line) and the PL (full line) of a conversion layer which comprises 33×7 nm CdSe/CdS RSNPs embedded in polymer PVB film.

A RSNP conversion layer was prepared as follows: 0.5 g of Poly(vinyl butyral-co-vinyl alcohol-co-vinyl acetate) (PVB), a resin usually used for applications that require strong binding, optical clarity, adhesion to many surfaces, toughness and flexibility and commercially available from Sigma-Aldrich (3 Plaut St., Rabin Park, Rehovot 76100, Israel) were dissolved in 4 ml Toluene. 12 mg of RSNPs were dissolved in 1 ml Toluene to form a RSNP solution. The RSNP solution was added to the polymer mixture while stirring. The mixture was transferred to a pattern vessel which was inserted into a dessicator and vacuumed for 15 hours, after which the mixture became solid. The resulting film thickness was 190 µm. The optical characteristics of the conversion layer are presented in FIG. 11, which shows the absorption (dotted line) and the PL (full line) spectra. The emission maximum is at 635 nm, with a FWHM of 30 nm. The absorption OD is 1.18 at 455 nm, 0.07 at 540 nm and <0.046 at 600-750 nm, i.e. 25 times smaller than the OD at 455 nm. This RSNP layer therefore funnels light from blue to red emission.

The RSNP layer was incorporated in a lighting device similar to that of FIG. 5A. In the lighting device, a UV LED at 360 nm was used to illuminate the RSNP layer, providing light output in the red, at 635 nm. Negligible UV output was detected, as the UV light was absorbed and converted very effectively by the RSNP layer.

Example 2

Lighting Device with Diffusive RSNP Conversion Layer within Polymer Host Providing Combination of Blue and Red Light A diffusive RSNP layer was prepared using the procedure in Example 1, with a modification that 1.3 mg of RSNP was dissolved in 1 ml Toluene and that after the 10 minutes stirring of RSNPs in polymer, 5 mg of $BaSO_4$ particles were added to the solution and stirred for another 15 minutes. The resulting film had diffusive properties that enhanced the optical emission and increased the extraction of the light in a required direction.

Figure 12:
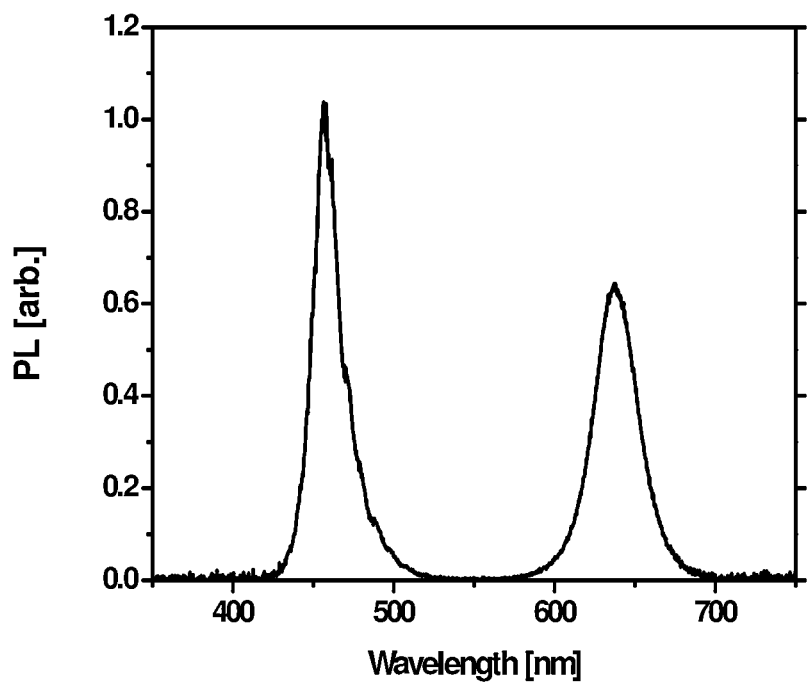
FIG. 12A shows the light spectrum of a lighting device comprising a 455 nm blue LED with a conversion layer which comprises 33×7 nm CdSe/CdS RSNPs embedded in a PVB film with added $BaSO_4$ particles.
FIG. 12B shows the light spectrum of a lighting device comprising a 455 nm blue LED with a conversion layer which comprises 27×5.5 nm CdSe/CdS RSNPs embedded in a Silicone RTV film.
Figure 12:
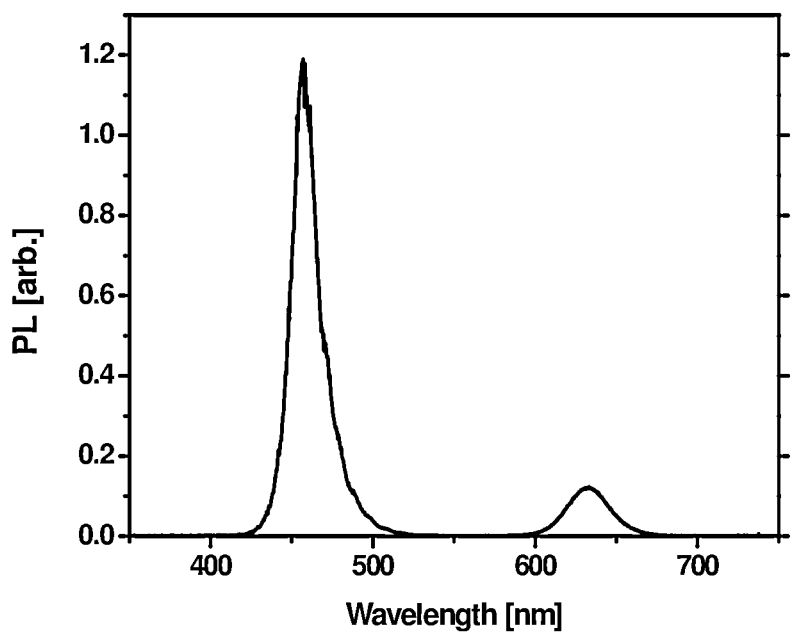

The RSNP layer was incorporated in a lighting device as shown in FIG. 5B. A blue LED emitting at 455 nm was used to illuminate the RSNP layer. The lighting output was measured and the light spectrum is presented in FIG. 12A, which shows a combination of a blue remnant from the blue LED and a red component from the RSNP conversion layer.

Example 3

Lighting Device with RSNP Conversion Layer within Silicone RTV Providing Combination of Blue and Red Light A RSNP layer in Silicone RTV was prepared as follows: 1 g of RTV615A (Momentive, 22 Corporate Woods Boulevard, Albany, N.Y. 12211 USA) was stirred with 0.1 g of RTV615B for 10 min. 1.5 mg of CdSe/CdS RSNPs with overall dimensions of 27×5.5 nm emitting at 635 nm was dissolved in 250 μl Toluene. The RSNP solution was added to the silicone mixture while stirring, then vacuumed until no bubbles remained. The solution was then deposited on a glass substrate and sandwiched using another glass substrate. 600 μm-thick spacers were positioned between the two glass substrates to obtain the desired film thickness. The sandwiched structure was then placed on a hot plate at 150° C. for 15 minutes, after which the solution became solid. The measured film thickness was 600 μm.

The RSNP layer was incorporated in a lighting device as shown in FIG. 5B. A blue LED emitting at 455 nm was used to illuminate the RSNP layer. The lighting output was measured and the light spectrum is presented in FIG. 12B, which shows a combination of a blue remnant from the blue LED at 455 nm and a red component from the RSNP layer at 635 nm with a FWHM of 30 nm.

Example 4

Figure 13:
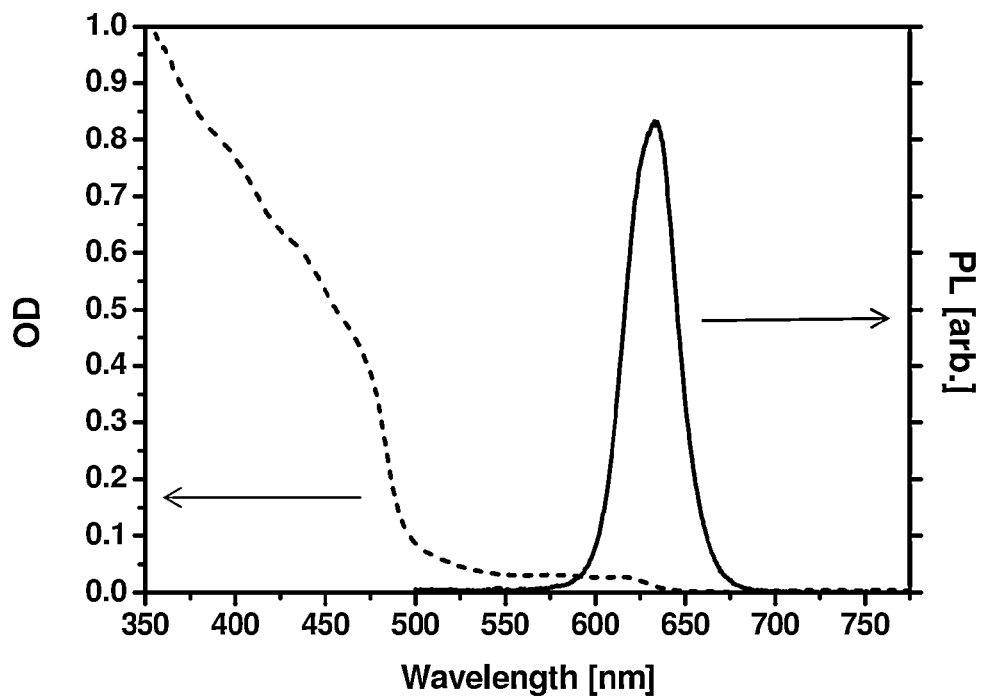
FIG. 13A shows the absorption (dotted line) and the PL spectra (full line) of a dense spin coated red emitting RSNP layer on glass.
FIG. 13B shows the absorption (dotted line) and the PL spectra (full line) of a dense spin coated green emitting RSNP layer on glass.
Figure 13:
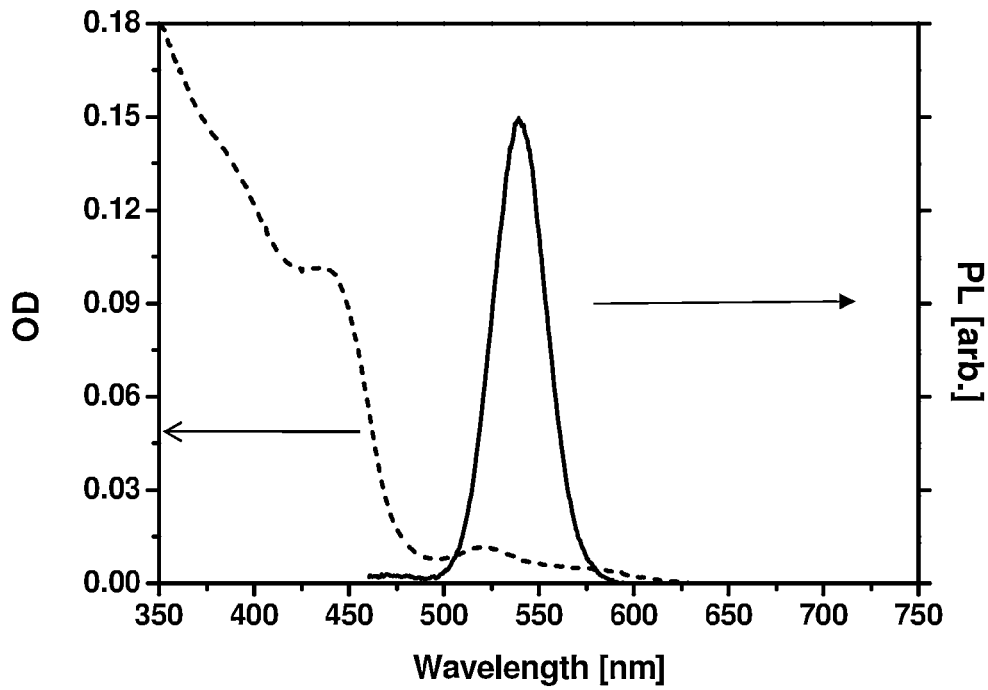

Lighting Device with Thin Dense Spin-Coated RSNP Conversion Layer Providing Red Light A dense RSNP layer was prepared as follows: first prepared was a solution of 35×5.4 nm CdSe/CdS RSNPs, emitting at 635 nm, in Toluene with 1:4 weight/volume (mg/μL) ratio. 20 μL of the solution was drop cast on a soda lime glass substrate and spread by spin coating at 2000 rpm. The deposited film was measured to have an absorbance OD of 0.51 at 455 nm, and OD of 0.9 at 360 nm. The thickness was 0.510 um as measured by a profilometer. FIG. 13A shows the absorption (dotted line) and the PL (full line) spectra of this RSNP layer. The emission maximum is at 633 nm, with a FWHM of 33 nm. The absorption OD is 0.96 at 360 nm, 0.5 at 455 nm, 0.035 at 540 nm and 0.025 at 600-750 nm, the latter 20 times smaller than the OD at 455 nm.

The RSNP layer was incorporated in a lighting device as shown in FIG. 5A. A UV LED at 360 nm was used to illuminate the RSNP layer, and provided light output in the red at 633 nm (not shown).

Example 5

Lighting Device with Thin Dense Spin-Coated RSNP Conversion Layer Providing Green Light A dense RSNP layer was prepared as follows: A solution of green emitting 20×3.5 nm CdSe/CdS RSNPs in Toluene with 1:5 weight/volume (mg/μL) ratio was prepared. 20 μL of solution containing the RSNPs was drop cast on a soda lime glass substrate and spread by spin coating at 2000 rpm. The deposited film was measured to have an absorbance OD of 0.07 at 455 nm and a thickness of 230 nm as measured by a profilometer. FIG. 13B shows the absorption (dotted line) and the PL (full line) spectra of this RSNP layer. The emission maximum is at 540, with a FWHM of 33 nm. The absorption OD is 0.165 at 360 nm, and 0.008 at 540 nm, the latter 20 times smaller than the OD at 360 nm.

The RSNP layer was incorporated in a lighting device as shown in FIG. 5A. A UV LED at 360 nm was used to illuminate this RSNP layer, and provided light output in the red, at 540 nm (not shown).

Example 6

Lighting Devices with RSNP Conversion Layers Providing White Light

Two RSNP layer samples were prepared using the methods described above for PVB with scatterers (example 2) RSNP layer CL14A had 10 mg of red emitting RSNPs and 25 mg of $BaSO_4$, inserted into 0.5 g of PVB. RSNP layer CL14B had 20 mg of red emitting RSNP and 25 mg of $BaSO_4$, inserted into 0.5 g of PVB. Each of the two samples was 190 μm-thick and had a diameter of 42 mm.

Figure 14:
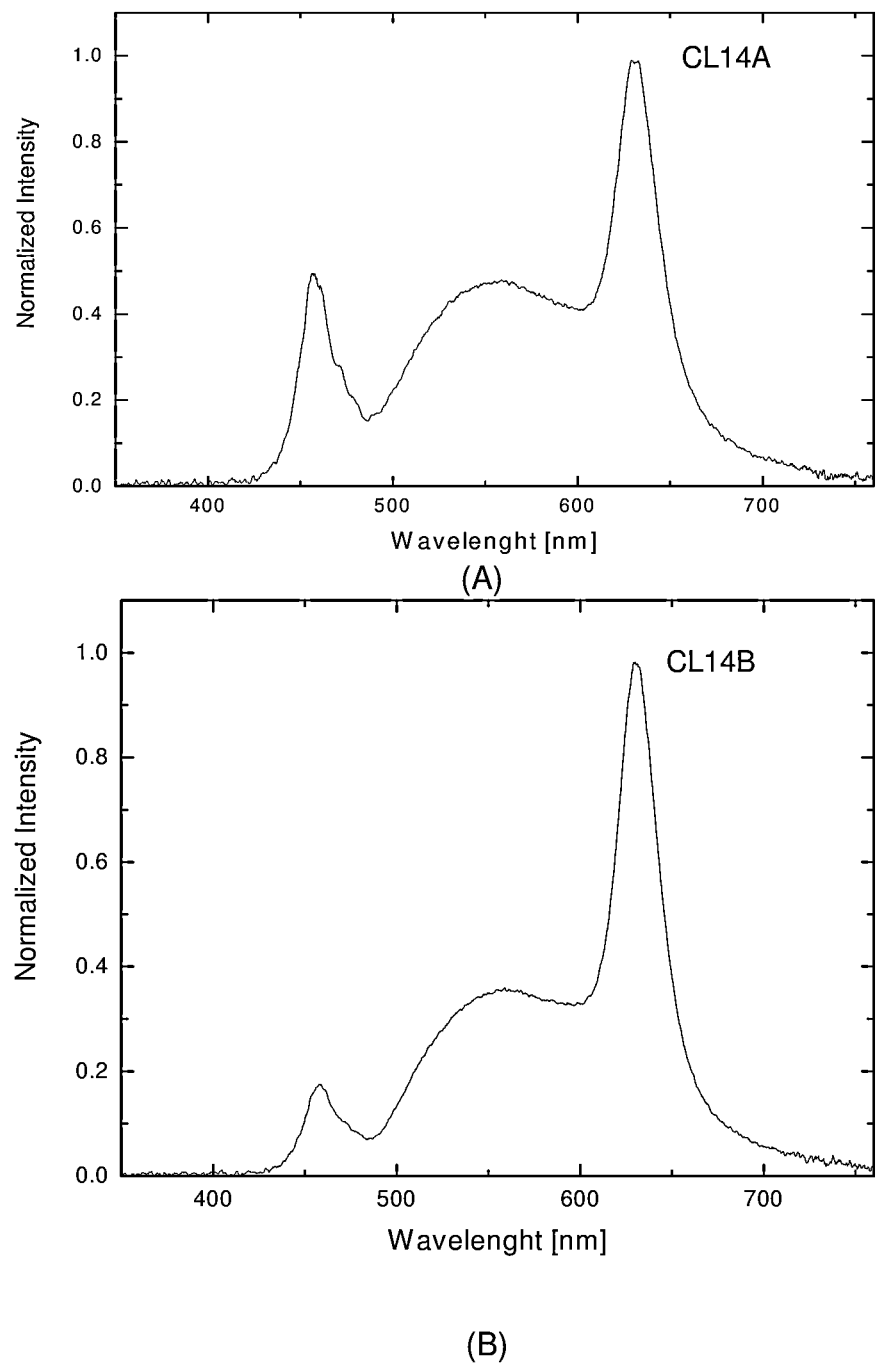
FIG. 14A shows the normalized light spectrum of a lighting device comprising a broad band LED based element with a SNP conversion layer.
FIG. 14B shows the normalized light spectrum of a lighting device comprising a broad band LED based element with another SNP conversion layer.
Figure 15:
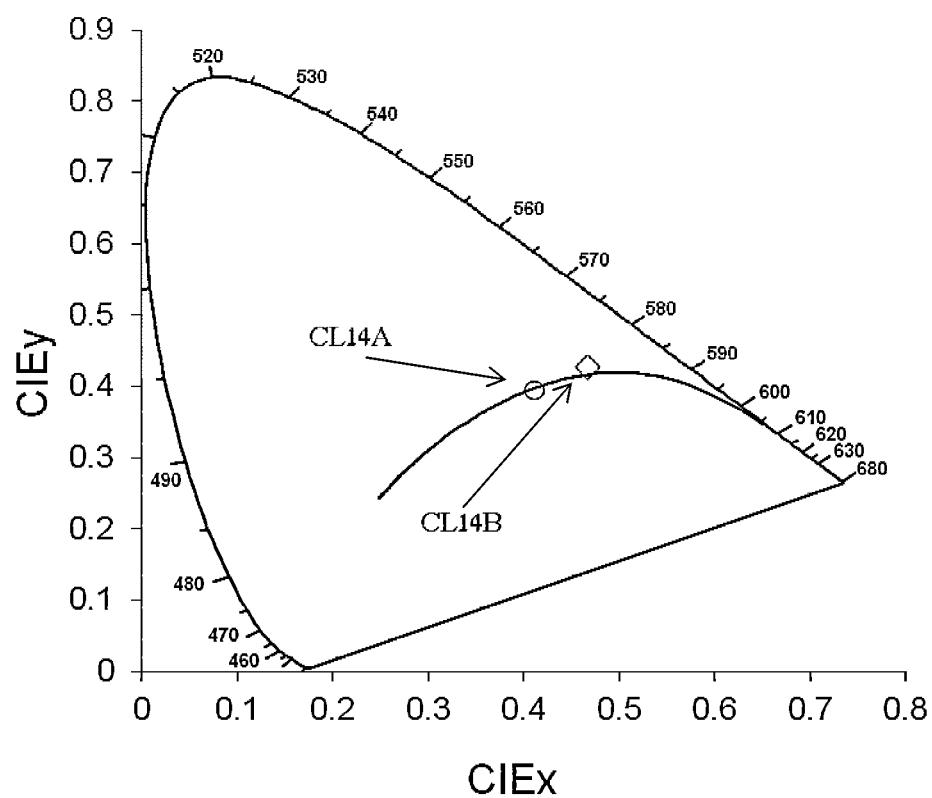
FIG. 15 shows a CIE chart with the two outputs of FIGS. 14A, B marked as shown.

The RSNP layers were incorporated in two lighting devices as shown in FIG. 6B. In both lighting devices, the RSNP layers were placed at the aperture of a LED module composed of a blue LED source and a specially prepared Ce:YAG based phosphor layer in a silicone matrix. The light output was measured and is shown in FIGS. 14A and B, for a lighting device with layers CL14A and CL14B, respectively. The light seen is composed of contributions of blue light from the 455 nm LED, a broad peak around 580 nm for the Ce-YAG based phosphor and red light from the RSNP layer. The CIE 1931 coordinates were calculated and the location of the two lighting devices on the CIE Chromaticity Diagram is shown in FIG. 15. The CCT for CL14A is 3420 K and for CL14B is 2730 K while the CRI for CL14A is 95 and for CL14B is 92.

Example 7

Lighting Devices with SNP Conversion Layers Providing White Light

Figure 16:
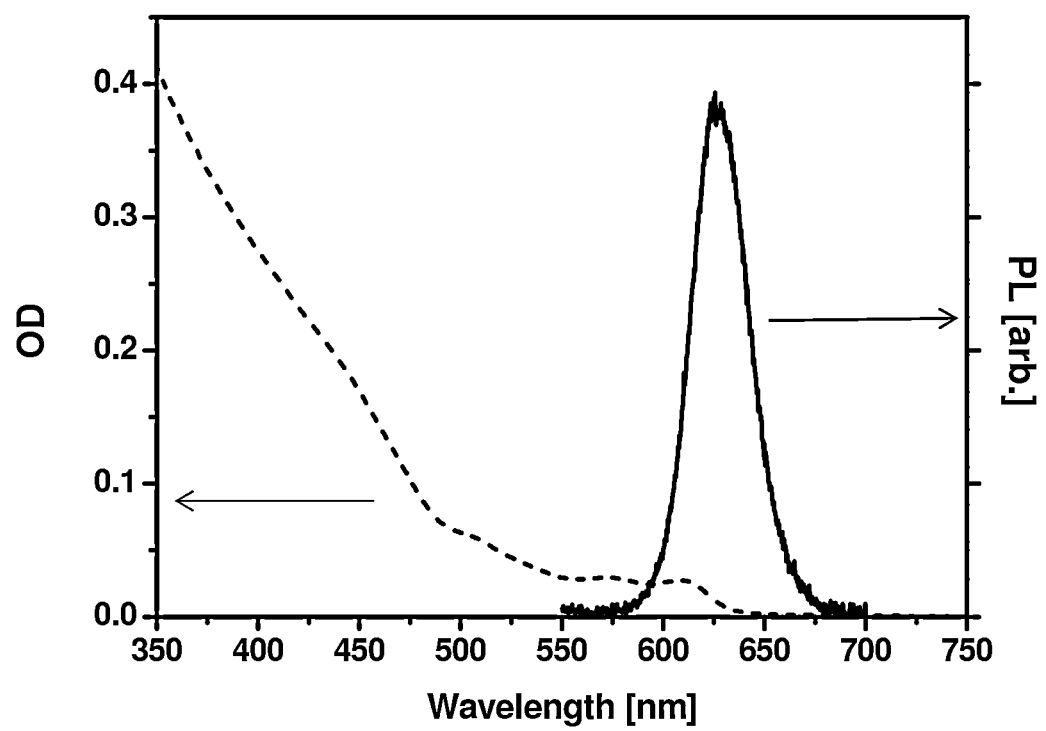
FIG. 16 shows the absorption (dotted line) and the PL spectra (full line) of the SNP film of Example 7.

The SNP used was a non-rod shaped CdSe\CdZnS SNP with CdSe core diameter of 3.9 nm and overall diameter of 8.9 nm. 0.5 gr of PVB were dissolved in 4 ml Toluene. 2 mgr of SNP was dissolved in 1 ml Toluene. The SNP solution was added to the polymer mixture while stirring. After 10 min stirring, the mixture had a shining glow. The mixture was then transferred to a pattern vessel which was inserted in a dessiccator and vacuumed for 15 hours, after which the mixture became solid. The final film thickness was 190 um. FIG. 16 shows the absorption (dotted line) and the PL spectra of this film. The CWL is at 626 nm and the FWHM is 33 nm. The absorption ratio between absorption at 455 to maximum absorption in 600-700 nm range is 1:6 (0.156 to 0.026). The SNP layer was incorporated in a lighting device as shown in FIG. 5A. A UV LED at 360 nm was used to illuminate this RSNP layer, and provided light output in the red, at 626 nm (not shown).

In conclusion, various embodiments of the invention provide devices incorporating novel conversion layers based on SNPs. Conversion layers disclosed herein are characterized by low re-absorption in the emission region compared with the absorbance in the exciting wavelength. SNP/RSNP conversion layers disclosed herein are suitable for enhancing the properties of LED devices to provide white emission with a CCT<4000K with a high CRI>80 and even >85, in particular a CCT<3500 and even a CCT-2700K with CRI>89. Polymer embedded SNP conversion layers of the invention can be further prepared to provide a white colour for display applications composed of three or more primary colours with a narrow FWHM<60 nm and even a FWHM<40 nm.

The invention has been described with reference to embodiments thereof that are provided by way of example and are not intended to limit its scope. The described embodiments comprise different features, not all of which are required in all embodiments of the invention. Some embodiments of the invention utilize only some of the features or possible combinations of the features. Variations of embodiments of the described invention and embodiments of the invention comprising different combinations of features than those noted in the described embodiments will occur to persons of ordinary skill in the art. The scope of the invention is limited only by the following claims.

All patents, patent applications and publications mentioned in this specification are herein incorporated in their entirety by reference into the specification, to the same extent as if each individual patent, patent application or publication was specifically and individually indicated to be incorporated herein by reference. In addition, citation or identification of any reference in this application shall not be construed as an admission that such reference is available as prior art to the present invention.

The invention claimed is:

1. An optical conversion layer for use in a lighting device in which a light source emits light of a first wavelength, the conversion layer comprising at least one type of semiconductor nanoparticles having a central emission wavelength (CWL) in the range 520-580 nm, the conversion layer characterized by having an optical density (OD) between 0.05 and 2 at 405 nm and an absorption ratio (AR) of absorbance at 405 nm to a maximum value of absorbance in the range 520-600 nm greater than 3.5:1, wherein the conversion layer may be used to convert at least part of the light of the first wavelength into light of a second wavelength longer than the first wavelength.

2. The conversion layer of claim 1, wherein the nanoparticles are seeded nanoparticles (SNPs).

3. The conversion layer of claim 2, wherein the seeded nanoparticles are nanorod seeded particles (RSNPs).

4. The conversion layer of claim 2, further comprising a host material which incorporates the nanoparticles.

5. The conversion layer of claim 4, wherein the host material is a polymer or a silicone.

6. The conversion layer of claim 5, wherein the layer is thinner than about 5000 µm.

7. The conversion layer of claim 1, wherein the AR is higher than 7:1.

8. The conversion layer of claim 1, further characterized by at least one of the following: (1) having a photoluminescence (PL) shift smaller than about 5 nm, wherein the PL shift represents the difference between a CWL measured in Toluene at OD<0.1 and a CWL measured in the conversion layer; (2) comprising at least one excess organic ligand not bound to any SNP surface.

9. The conversion layer of claim 1, wherein the layer is thinner than about 5 µm.

10. A lighting device comprising:
    a) a light source which emits source light of a first wavelength; and
    b) a conversion layer configured according to claim 1, the conversion layer being used to convert at least part of light of the first wavelength into light of a second wavelength longer than the first wavelength.

11. The lighting device of claim 10, wherein the nanoparticles are seeded nanoparticles.

12. The lighting device of claim 11, wherein the seeded nanoparticles are nanorod seeded particles.

13. The lighting device of claim 10, wherein the light source is at least one light emitting diode (LED) and wherein the conversion layer enhances the lighting device light output to provide one of the following: (1) white light with a CCT<10000K and with a CRI>70; and (2) white light with a CCT<4500K and with a CRI>80.

14. An optical conversion layer for use in a lighting device in which a light source emits light of a first wavelength, the conversion layer comprising at least one type of semiconductor nanoparticles having a central emission wavelength in the range 520-700 nm, the conversion layer characterized by having an optical density between 0.07 and 2.5 at 405 nm and an absorption ratio of absorbance at 405 nm to a maximum value of absorbance in the range 520-700 nm greater than 3:1, wherein the conversion layer may be used to convert at least part of the light of the first wavelength into light of other wavelengths longer than the first wavelength.

15. A lighting device comprising the optical conversion layer of claim 14.

16. The lighting device of claim 14, wherein the conversion layer is adapted to pass through an unconverted part of the source light of the first wavelength.

17. A lighting device comprising:
    a) a light source which emits source light of a first wavelength; and
    b) the conversion layer configured according to claim 14, the conversion layer being used to convert at least part of light of the first wavelength into light into other wavelengths longer than the first wavelength.

18. The lighting device of claim 17, wherein the nanoparticles are seeded nanoparticles.

19. The lighting device of claim 18, wherein the seeded nanoparticles are nanorod seeded particles.

20. The lighting device of claim 17, wherein the light source is at least one light emitting diode and wherein the conversion layer enhances the lighting device light output to provide one of the following: (1) white light with a CCT<10000K and with a CRI>70; (2) white light with a CCT<4500K and with a CRI>80.

21. The conversion layer of claim 14, wherein the seeded nanoparticles are rod shaped nanoparticles (RSNPs).

22. The conversion layer of claim 14, further characterized by at least one of the following: (i) having an AR between absorbance at 455 nm and a maximum value of absorbance in the wavelength range of 520-580 nm greater than 7:1; (ii) having a photoluminescence (PL) shift smaller than about 5 nm, wherein the PL shift represents the difference between a CWL measured in Toluene at OD<0.1 and a CWL measured in the conversion layer; and (iii) comprising at least one excess organic ligand not bound to any SNP surface.

23. The conversion layer of claim 14, wherein the layer is thinner than about 2 µm.

24. The conversion layer of claim 14, wherein the semiconductors are selected from the group consisting of II-VI, III-V IV-VI and III-VI$_2$ semiconductors.

25. The conversion layer of claim 14, wherein the nanoparticles have at least one of the following configurations: (a) comprise a core/shell structure with materials selected from the group consisting of CdSe/CdS, CdSeS/CdS, ZnSe/CdS, ZnCdSe/CdS, CdSe/CdZnS, CdTe/CdS, InP/ZnSe, InP/CdS, InP/ZnS and CuInS$_2$/ZnS; (b) a core/double shell structure with materials selected from the group consisting of CdSe/

CdS/ZnS, CdSe/CdZnS/ZnS, ZnSe/CdS/ZnS, InP/ZnSe/ZnS, InP/CdS/ZnS and InP/CdZnS/ZnS.

26. The conversion layer of claim 14, further comprising a host material which incorporates the nanoparticles.

27. The conversion layer of claim 26, wherein the host material is a polymer or a silicone.

28. The conversion layer of claim 27, wherein the layer is thinner than about 5000 μm.

29. The conversion layer of claim 14, comprising at least two types of nanoparticles, a first type comprising nanoparticles having central emission wavelength in the range of 520-600 nm and a second type of nanoparticles having central emission wavelength in the range of 580-700 nm.

30. The conversion layer of claim 14, further comprising at least one excess organic ligand not bound to any SNP surface.

31. The conversion layer of claim 14, being thinner than about 5000 μm.

32. The conversion layer of claim 14, being thinner than about 50 μm.

33. The conversion layer of claim 14, wherein the at least one type of semiconductor nanoparticles includes a plurality of types, each type performing conversion into light of a different wavelength longer than the first wavelength.

34. The conversion layer of claim 14, further characterized by at least one of the following: (i) having an AR between absorbance at 455 nm and a maximum value of absorbance in the wavelength range of 580-700 nm greater than 6:1; (ii) having a photoluminescence (PL) shift smaller than about 5 nm, wherein the PL shift represents the difference between a CWL measured in Toluene at OD<0.1 and a CWL measured in the conversion layer; and (iii) comprising at least one excess organic ligand not bound to any SNP surface.

35. The conversion layer of claim 14, further characterized by an absorption ratio of absorbance at 405 nm to a maximum value of absorbance in the range 520-700 nm greater than 6:1.

36. An optical conversion layer for use in a lighting device in which a light source emits light of a first wavelength, the conversion layer comprising at least one type of semiconductor nanoparticles having a central emission wavelength in the range 520-700 nm, the conversion layer characterized by having an optical density between 0.05 and 2.5 at 405 nm and an absorption ratio of absorbance at 405 nm to a maximum value of absorbance in the range 520-700 nm greater than 3:1, wherein the conversion layer may be used to convert at least part of the light of the first wavelength into light of other wavelengths longer than the first wavelength.

* * * * *